United States Patent
Zimmermann et al.

(10) Patent No.: US 9,715,222 B2
(45) Date of Patent: Jul. 25, 2017

(54) INFRASTRUCTURE CONTROL FABRIC SYSTEM AND METHOD

(75) Inventors: Arnaldo Zimmermann, Fremont, CA (US); Fanny Wakizaka, Fremont, CA (US); Marcelo E. Peccin, Milpitas, CA (US); Vibhor Kalley, San Jose, CA (US); Steven Geffin, Miami, FL (US); Bharat A. Khuti, Madison, AL (US); Sean Nicholson, Mendon, MA (US)

(73) Assignee: Avocent Huntsville, LLC, Huntsville, AL (US)

( * ) Notice: Subject to any disclaimer, the term of this patent is extended or adjusted under 35 U.S.C. 154(b) by 775 days.

(21) Appl. No.: 13/984,417

(22) PCT Filed: Feb. 9, 2012

(86) PCT No.: PCT/US2012/024405
§ 371 (c)(1),
(2), (4) Date: Oct. 16, 2013

(87) PCT Pub. No.: WO2012/109401
PCT Pub. Date: Aug. 16, 2012

(65) Prior Publication Data
US 2014/0039683 A1 Feb. 6, 2014

Related U.S. Application Data

(60) Provisional application No. 61/441,131, filed on Feb. 9, 2011, provisional application No. 61/469,357, filed on Mar. 30, 2011.

(51) Int. Cl.
*G05B 15/02* (2006.01)
*G06F 1/20* (2006.01)
(Continued)

(52) U.S. Cl.
CPC ............ *G05B 15/02* (2013.01); *G06F 1/206* (2013.01); *G06F 1/3206* (2013.01); *G06F 1/329* (2013.01);
(Continued)

(58) Field of Classification Search
None
See application file for complete search history.

(56) References Cited

U.S. PATENT DOCUMENTS 5,692,197 A * 11/1997 Narad .................. G06F 1/3209
713/310
6,587,950 B1 * 7/2003 Shah .................... G06F 1/3203
713/300
(Continued)

FOREIGN PATENT DOCUMENTS

TW 200923632 A 6/2009

OTHER PUBLICATIONS

FileZilla Screenshots, captured on Sep. 17, 2007, https://web.archive.org/web/20070917040650/http://filezilla-project.org/client_screenshots.php.*

(Continued)

*Primary Examiner* — Christopher E Everett
(74) *Attorney, Agent, or Firm* — Harness, Dickey & Pierce, P.L.C.

(57) ABSTRACT

A data center infrastructure management (DCIM) system having an infrastructure control fabric (ICF) subsystem for enabling a manager component of an independent computing device to communicate directly with the DCIM system. The DCIM system, in one embodiment, may have a manageability subsystem engine for monitoring data being transmitted from the independent computing device. A domain model may be included that has an extension relating to information on the independent computing device. A ser- (Continued)

vices server may be used which provides a shared services infrastructure layer. The ICF subsystem may have components located in each of the manageability subsystem engine, the domain model, on the services server, and in the manager component of the independent computing device, to enable the independent computing device to directly query the DCIM system to obtain at least one of real time power, cooling and space information that is useful for the independent computing device to know before at least one of initiating an operation or continuing with an operation.

23 Claims, 45 Drawing Sheets

(51) Int. Cl.
*G06F 1/32* (2006.01)
*G06F 11/30* (2006.01)
*H04L 12/26* (2006.01)
*H05K 7/14* (2006.01)
*H04L 12/24* (2006.01)

(52) U.S. Cl.
CPC ........ *G06F 1/3287* (2013.01); *G06F 11/3006* (2013.01); *G06F 11/3044* (2013.01); *G06F 11/3058* (2013.01); *H04L 43/0817* (2013.01); *H05K 7/1498* (2013.01); *G06F 11/3048* (2013.01); *G06F 11/3062* (2013.01); *H04L 41/0213* (2013.01); *H04L 43/16* (2013.01); *Y02B 60/1275* (2013.01); *Y02B 60/1282* (2013.01); *Y02B 60/144* (2013.01)

(56) References Cited

U.S. PATENT DOCUMENTS

| | | | | |
|---|---|---|---|---|
| 8,495,393 | B2* | 7/2013 | Oh | G06F 1/3203 709/226 |
| 8,578,048 | B2* | 11/2013 | Kiefer | H04L 12/24 370/351 |
| 9,172,611 | B2* | 10/2015 | Guruswamy | H04L 41/12 |
| 2002/0158898 | A1* | 10/2002 | Hsieh | G06F 8/61 715/736 |
| 2003/0196126 | A1* | 10/2003 | Fung | G06F 1/3203 713/300 |
| 2005/0125703 | A1 | 6/2005 | Lefurgy et al. | |
| 2005/0246529 | A1* | 11/2005 | Hunt | H04L 9/3273 713/168 |
| 2006/0080596 | A1* | 4/2006 | Bhogal | G06F 9/542 715/213 |
| 2006/0156041 | A1* | 7/2006 | Zaretsky | G06F 1/3287 713/300 |
| 2006/0253715 | A1 | 11/2006 | Ghiasi et al. | |
| 2007/0050650 | A1 | 3/2007 | Conroy et al. | |
| 2009/0144566 | A1 | 6/2009 | Bletsch et al. | |
| 2011/0061015 | A1* | 3/2011 | Drees | G05B 15/02 715/771 |
| 2012/0198037 | A1* | 8/2012 | Shelby | H04L 41/0213 709/223 |

OTHER PUBLICATIONS

SIPO 1st Office Action issued on Jun. 26, 2015 in corresponding Chinese Patent Application No. 201280017606.5, 10 pages.
AVOCENT: "Data Center Infrastructure Management (DCIM) White Paper", Internet Citation, Sep. 2010 (Sep. 2010), pp. 1-16, XP002663281, Retrieved from the Internet: URL:http://www.edcosurge.com/en-US/About/Events/Documents/OOW-MediaKit/10_DCIM_Trellis.pdf [retrieved on Nov. 9, 2011].
Femal M.E. et al: "Boosting Data Center Performance Through Non-Uniform Power Allocation", Autonomic Computing, 2005. ICAC 2005. Proceedings. Second International Conference on Seattle, WA, USA Jun. 13-16, 2005, Piscataway, NJ, USA, IEEE, Jun. 13, 2005 (Jun. 13, 2005), pp. 250-261, XP010831194, DOI: 10.1109/ICAC.2005.17 ISBN:978-0-7965-2276-4.
Chess D.M. et al: "The Vision of Autonomic Computing", Computer, IEEE Service Center, Los Alamitos, CA, US, vol. 36, No. 1, Jan. 1, 2003 (Jan. 1, 2003), pp. 41-50, XP011095404, ISSN: 0018-9162, DOI: 10.1109/MC.2003.1160055.
International Search Report and Written Opinion (both in English) for PCT/US2012/024405, mailed May 29, 2012; ISA/EP.

\* cited by examiner

| No | Use Case ID | Name | Description |
|---|---|---|---|
| 1 | UC-DISC-01 | DCIM discovers UCS | DCIM discovers UCS after information about UCS is configured using MSS UI. |
| 2 | UC-DISC-02 | UCS-triggered discovery | DCIM discovers UCS after being contacted by UCSM when information about DCIM is configured through UCSM GUI. |
| 3 | UC-PROV-01 | Select UCS from the symbol library | User provisions UCS devices by opening symbol library and selecting UCS device in Inventory Application. |
| 4 | UC-PROV-02 | Search for space, power and cooling to install UCS device | Inventory Application searches for available space, power and cooling on racks to place the selected UCS device. |
| 5 | UC-PROV-03 | Repositioning installed UCS device | Select installed UCS device and drag and drop it into different rack or chassis position. |
| 6 | UC-PROV-04 | Connecting UCS devices | Enter connectivity information for UCS devices. |
| 7 | UC-PWR-CAP-01 | Push static power budget | DCIM allows user to set static power budget for a UCS Chassis. |
| 8 | UC-PWR-CAP-02 | Configure scheduled power budget | DCIM allows user to schedule power budget changes for a UCS chassis. |
| 9 | UC-PWR-CAP-03 | Update power budget based on rules | DCIM allows user to enter rules that trigger actions for setting the power budget of UCS Chassis. |
| 10 | UC-PWR-LCK-01 | Locking and unlocking the power state of a server | DCIM allows user to lock and unlock the power state of UCS servers. |
| 11 | UC-QUERY-01 | UCSM queries if servers can be turned on | UCSM queries DCIM about servers to be turned on from a list of servers. |
| 12 | UC-QUERY-02 | UCSM queries if servers can be turned off | UCSM queries DCIM about servers to be turned off from a list of servers. |
| 13 | UC-QUERY-03 | UCSM queries the cost of empty slots | UCSM queries DCIM about the cost of empty slots in a list |

FIGURE 13A

| 14 | UC-QUERY-04 | UCSM queries environmental datacenter information | UCSM queries DCIM about environmental datacenter information for a list of UCS devices. |
|---|---|---|---|
| 15 | UC-RCV-NOTIF-01 | DCIM receives UCS notifications | DCIM receives UCS notifications via traps and/or XML API. |
| 16 | UC-STAT-01 | DCIM monitors UCSM data points | DCIM monitors UCSM data points using XML API. |
| 17 | UC-SND-NOTIF-01 | DCIM communicates critical conditions to UCSM | DCIM communicates UCSM about critical operational conditions using XML API. |

FIGURE 13B

*DCIM discovers UCS (UC-DISC-01)*

| | |
|---|---|
| Description | DCIM discovers UCS after information about UCS is configured using MSS UI. |
| Trigger | User action. |
| Main Flow | User logs in to DCIM, navigates to the properties page (which will be extended to support Cisco UCS) and enters UCS identification and credentials. |
| Assumptions | • UCSM offers API to save DCIM public certificate.<br>• UCSM offers API that provides UCS public certificate. |
| Notes | UCS infrastructure devices include: Fabric Interconnects, Chassis, Fans, Power Supplies, Fabric Extenders, Full-width and Half-width Blades, and Rack-mount Servers. DCIM R1 treats Chassis Fans and Chassis Power Supplies as part of the Chassis structure.<br>FD-DISC-01    MSS UI shall provide means for the user to enter UCS identification and credentials (UCS FQDN or IP, username, and password) under enrollment page.<br>FD-DISC-02    MSS UI shall provide a way to reset authentication from certificate back to username and password after DCIM certificate is saved in UCS (for example: DCIM certificate changes or is lost by UCS). See FD-DISC-04.<br>FD-DISC-03    Cisco Element Library shall have the ability to login to UCSM through XML API using username and password.<br>FD-DISC-04    Cisco Element Library shall have the ability to save DCIM public certificate for next connections using XML API. All subsequent connections to USCM shall use DCIM public certificate, but see FD-DISC-02.<br>FD-DISC-05    Discovery: Cisco Element Library shall have the ability to contact UCSM using XML API and retrieve necessary information to create UCS representation in the CDMR (Common Data Model Repository).<br>FD-DISC-06    Domain Model shall be extended to support Cisco UCS infrastructure components (see Notes and Issues above).<br>FD-DISC-07    Cisco Element Library shall have the ability to contact UCSM using XML API and retrieve UCS public certificate so UCSM can start using DCIM web services. |

FIGURE 16A

UCS-triggered discovery (UC-DISC-02)

| | |
|---|---|
| Description | DCIM discovers UCS after being contacted by UCSM when information about DCIM is configured through UCSM GUI. |
| Trigger | User action. |
| Main Flow | User logs in to UCSM GUI, navigates to DCIM tab and enters DCIM identification and credentials (DCIM FQDN or IP, username, and password). |
| Assumptions | • UCSM GUI has DCIM tab implemented.<br>• UCSM uses web services to get DCIM public certificate.<br>• UCSM offers API that provides UCS public certificate. |
| Notes | FD-DISC-08    Cisco Web Services shall provide UCS login service using username and password for the first UCSM login.<br>FD-DISC-09    Cisco Web Services shall provide a service for UCSM to get DCIM public certificate.<br>FD-DISC-10    Cisco Element Library shall have the ability to login to UCSM through XML API using public certificate.<br>FD-DISC-11    Login and GetDCIMCertificate shall be the only Cisco Web Services offered before UCS infrastructure is discovered and UCS public certificate successfully retrieved and saved. |

FIGURE 16B

Select UCS device from the symbol library (UC-PROV-01)

| | |
|---|---|
| Description | User provisions UCS devices by opening symbol library and selecting UCS device in Inventory Application. |
| Trigger | User action. |
| Main Flow | User logs in to DCIM and using the Inventory Application selects UCS device from symbol library. |
| Assumptions | None. |
| Actors | Inventory Application. |
| Notes | UCS infrastructure devices include: Fabric Interconnects, Chassis, Fans, Power Supplies, Fabric Extenders, Full-width and Half-width Blades, and Rack-mount Servers. DCIM R1 will treat Chassis Fans and Chassis Power Supplies as part of the Chassis structure. A comprehensive research on models and variations needs to be done during the detailed design phase.<br>FD-PROV-01    Inventory Application shall include UCS Infrastructure devices in symbols library. |

FIGURE 16C

Search for space, power and cooling to install UCS device (UC-PROV-02)

| Description | Inventory Application searches for available space, power and cooling on racks to place the selected UCS device. |
|---|---|
| Trigger | UCS device selection by user. |
| Pre-Conditions | Racks and power strips are installed and have empty positions. |
| Post-Conditions | Success end condition<br>Possible places are found and shown to the user.<br>Failure end condition<br>When search criteria are not met the user is shown an appropriate message.<br>Minimal Guarantee<br>The minimal guarantee is the same as the success end condition. |
| Main Flow | 1. Using the Inventory Application the user was able to find the desired UCS device in the symbol library.<br>2. User executes the search criteria for locations to place the UCS device. |
| Assumptions | None. |
| Notes | The same search should be executed when existing equipment is selected to be repositioned.<br>FD-PROV-02    Cisco Application shall extend Inventory Application to add blade search criteria accounting for two-slot blades (full-width blades) and power budget of a chassis.<br>FD-PROV-03    Cisco Application shall extend Inventory Application to add search criteria for special UCS devices such as Fabric Interconnects, Fans and Power Supplies for the Chassis, and Fabric Extenders. |

FIGURE 16D

Repositioning installed UCS device (UC-PROV-03)

| Description | Select installed UCS device and drag and drop it into different rack or chassis position. |
|---|---|
| Trigger | User action. |
| Actors | Inventory Application (or Change Planner?), Cisco Element Library. |
| Pre-Conditions | UCS device is already installed in DCIM. |
| Post-Conditions | Success end condition<br>• User successfully drops selected UCS device to desired position.<br>• DCIM notifies UCSM about new device location after user acknowledges the physical relocation.<br>Failure end condition<br>The procedure should never fail if user selects any proposed placement option.<br>Minimal Guarantee<br>The minimal guarantee is the same as the success end condition. |
| Main Flow | 1. Using the Inventory Application the user moves the installed UCS device to another location.<br>2. Equipment is physically moved.<br>3. User acknowledges the physical relocation in Inventory Application.<br>4. DCIM notifies UCSM about new device location. |
| Assumptions | None. |
| Notes | FD-PROV-04    After placing selected UCS device into the chosen rack or chassis position the Inventory Application shall coordinate with Cisco Element Library to notify UCSM about the location change. |

FIGURE 16E

Connecting UCS devices (UC-PROV-04)

| Description | Enter connectivity information for UCS devices. |
|---|---|
| Trigger | User action. |
| Actors | Configuration Application. |
| Pre-Conditions | UCS device is placed into available rack or chassis position but not connected. |
| Post-Conditions | Success end condition<br>UCS infrastructure connections are created.<br>Failure end condition<br>Connections cannot be completed.<br>Minimal Guarantee<br>The minimal guarantee is the same as the success end condition. |
| Main Flow | 1. Using the Inventory Application the user has placed a UCS device on a rack.<br>2. User enters UCS device connections. |
| Assumptions | None. |
| Notes | FD-PROV-05    Configuration Application shall understand all types of UCS device connections, including interconnections inside the Cisco UCS fabric (for example, the only connections allowed for Fabric Extenders are connections to a single Fabric Interconnect). |

FIGURE 16F

Push static power budget (UC-PWR-CAP-01)

| | |
|---|---|
| Description | DCIM allows user to set static power budget for a UCS Chassis. |
| Trigger | User action. |
| Actors | Inventory Application, Cisco Element Library, UCSM. |
| Pre-Conditions | USC Chassis is present in the CDMR. |
| Post-Conditions | Success end condition<br>Cisco Element Library communicates with UCSM to push desired power budget to USC Chassis.<br>Failure end condition<br>The user is notified that the action failed.<br>Minimal Guarantee<br>The minimal guarantee is the same as the success end condition. |
| Main Flow | User logs in to DCIM and using the Inventory Application selects a UCS Chassis to set its power budget. |
| Assumptions | UCSM offers API to configure Chassis power budget. |
| Notes | When Service Profiles are tracked by DCIM, the user will see the list of Service Profiles (and priorities) running on a chassis.<br>FD-PWR-CAP-01  Inventory Application shall allow UCS Chassis power budget configuration.<br>FD-PWR-CAP-02  Inventory Application shall coordinate with Cisco Element Library to push UCS Chassis power budget using XML API. |

FIGURE 16G

Configure scheduled power budget (UC-PWR-CAP-02)

| Description | DCIM allows user to schedule power budget changes for a UCS Chassis. |
|---|---|
| Trigger | User action. |
| Actors | CPS UI, CPS Services, Cisco Element Library, UCSM. |
| Pre-Conditions | UCS Chassis is present in the CDMR. |
| Post-Conditions | Success end condition<br>• User schedules power budget changes for USC Chassis.<br>• At the scheduled time, Cisco Element Library communicates the new power budget to UCSM.<br>Failure end condition<br>• The user is notified that CPS Services does not allow scheduling at the moment.<br>• Scheduled action fails to complete and a log is generated.<br>Minimal Guarantee<br>The minimal guarantee is the same as the success end condition. |
| Main Flow | User logs in to DCIM, navigates to the scheduler configuration page and enters scheduling data to change UCS Chassis power budget. |
| Assumptions | • UCSM offers API to configure Chassis power budget.<br>• Scheduling functionality is offered by CPS Services. |
| Notes | When Service Profiles are tracked by DCIM, the user will be able to see the list of Service Profiles (and priorities) running on a chassis.<br>FD-PWR-CAP-03   CPS UI and CPS Services shall allow user to schedule UCS Chassis power budget configuration.<br>FD-PWR-CAP-04   CPS Services shall coordinate with Cisco Element Library to set the appropriate UCS Chassis power budget as scheduled. |

FIGURE 16H

Update power budget based on rules (UC-PWR-CAP-03)

| | |
|---|---|
| Description | DCIM allows user to enter rules that trigger actions for setting the power budget of UCS Chassis. |
| Trigger | User action. |
| Main Flow | User logs in to DCIM, navigates to rules configuration page and enters rules to change UCS Chassis power budget. |
| Assumptions | • UCSM offers API to configure Chassis power budget. |
| Actors | CPS UI (or Monitoring Application?), CPS Services, Cisco Element Library, UCSM. |
| Pre-Conditions | UCS Chassis is present in the CDMR. |
| Post-Conditions | Success end condition<br>• User enters rules to control power budget of USC Chassis.<br>• The rules are constantly evaluated and actions are executed accordingly.<br>Failure end condition<br>• The user is notified that CPS Services could not successfully create the rules.<br>• Triggered action fails to complete and a log is generated.<br>Minimal Guarantee<br>The minimal guarantee is the same as the success end condition. |
| Notes | • The rules referred in this use case are based on real-time resource availability (power and cooling) or any other datacenter policy.<br>• When Service Profiles are tracked by DCIM, the user should be able to see the list of Service Profiles (and priorities) running on a chassis.<br>FD-PWR-CAP-05   CPS UI and CPS Services shall allow the creation of rules that trigger actions for setting the power budget of UCS Chassis (see Notes and Issues above).<br>FD-PWR-CAP-06   CPS Services shall coordinate with Cisco Element Library to set the appropriate UCS Chassis power budget as trigger condition occurs.<br>• FD-PWR-CAP-07   CPS UI shall provide a way for the user to easily see scheduled actions and rules affecting a UCS Chassis.<br>• FD-PWR-CAP-08   The scheduling and rules UI shall provide a way for the user to refer to the static power budget value (so it allows restoring such value without having to retype it). |

FIGURE 16I

Locking and unlocking the power state of a server (UC-PWR-LCK-01)

| | |
|---|---|
| Description | DCIM allows user to lock and unlock the power state of UCS servers. |
| Trigger | User action. |
| Main Flow | User logs in to DCIM and using the Inventory Application selects a UCS server to lock or unlock its power state. |
| Assumptions | None. |
| Actors | Inventory Application (?), CDMR |
| Pre-Conditions | UCS server is present in the CDMR. |
| Post-Conditions | Success end condition<br>Inventory Application saves new power state lock condition to DCMR.<br>Failure end condition<br>The user is notified that the action failed.<br>Minimal Guarantee<br>The minimal guarantee is the same as the success end condition. |
| Notes and Issues | When Service Profiles are tracked by DCIM, the user should be able to see the Service Profiles assigned to the UCS server.<br>FD-PWR-LCK-01   Inventory Application shall allow power state lock to be configured for a UCS server. |

FIGURE 16J

UCSM queries if servers can be turned on (UC-QUERY-01)

| Description | UCSM queries DCIM about servers to be turned on from a list of servers. |
|---|---|
| Trigger | User at UCSM GUI wants to turn on a server or UCSM needs to turn on a server based on other internal conditions. |
| Actors | UCSM, Cisco Web Services, MSS Web Services, Cisco Application, Operations Application. |
| Pre-Conditions | UCS infrastructure representation exists in the CDMR. |
| Post-Conditions | Success end condition<br>Depending on the mode of operation requested:<br>• DCIM answers with a sorted list of servers (optimal servers);<br>• DCIM answers with a list of servers (faster reply).<br>Failure end condition<br>DCIM cannot compute the list and replies that the query has failed.<br>Minimal Guarantee<br>DCIM provides UCSM an indication about the result of the query operation. |
| Main Flow | 1. UCSM uses ValidateServerAction web service with action PowerOn or PowerMaintenanceOn.<br>2. DCIM answers. |
| Assumptions | UCSM calls DCIM ValidateServerAction web service. |
| Notes | Since power consumption for maintenance mode (where only the utility OS is running) is less than the power consumption for the full power on state (where the production OS(s) run), DCIM needs to consider the following transitions:<br>• Server OFF → Server ON<br>• Server OFF → Server in Maintenance Mode<br>• Server in Maintenance Mode → Server ON<br>FD-QUERY-01 Cisco Web Services shall implement ValidateServerAction service where from a list of possible servers DCIM needs to decide which ones are possible options to be turned on based on real-time resource availability (power and cooling) or any other datacenter policy. |

FIGURE 16K

UCSM queries if servers can be turned off (UC-QUERY-02)

| Description | UCSM queries DCIM about servers to be turned off from a list of servers. |
|---|---|
| Trigger | User at UCSM GUI wants to turn off a server or UCSM needs to turn off a server based on other internal conditions. |
| Main Flow | 1. UCSM uses ValidateServerAction web service with action PowerOff.<br>2. DCIM answers. |
| Assumptions | UCSM calls DCIM ValidateServerAction web service. |
| Actors | UCSM, Cisco Web Services, MSS Web Services, Cisco Application, Operations Application. |
| Pre-Conditions | UCS infrastructure representation exists in the CDMR. |
| Post-Conditions | Success end condition<br>Depending on the mode of operation requested:<br>• DCIM answers with a sorted list of servers (optimal servers);<br>• DCIM answers with a list of servers (faster reply).<br>Failure end condition<br>DCIM cannot compute the list and replies that the query has failed.<br>Minimal Guarantee<br>DCIM provides UCSM an indication about the result of the query operation. |
| Notes and Issues | Since power consumption for maintenance mode (where only the utility OS is running) is less than the power consumption for the full power on state (where the production OS(s) run), DCIM needs to consider the following transitions:<br>• Server ON → Server OFF<br>• Server ON → Server in Maintenance Mode<br>• Server in Maintenance Mode → Server OFF<br>• FD-QUERY-02    Cisco Web Services shall implement ValidateServerAction service where from a list of possible servers DCIM needs to decide which ones are possible options to be turned off based on datacenter policies |

FIGURE 16L

UCSM queries the cost of empty slots (UC-QUERY-03)

| Description | UCSM queries DCIM about the cost of empty slots in a list. |
|---|---|
| Trigger | User at UCSM GUI wants to pre-provision a chassis slot to a service profile. |
| Actors | UCSM, Cisco Web Services, MSS Web Services, Cisco Application, Operations Application. |
| Pre-Conditions | UCS infrastructure representation exists in the CDMR. |
| Post-Conditions | Success end condition<br>DCIM answers adding power cost to the slot list.<br>Failure end condition<br>DCIM cannot compute the list and signals that the query has failed.<br>Minimal Guarantee<br>DCIM provides UCSM an indication about the result of the query operation. |
| Main Flow | 1. UCSM uses GetEmptySlotPowerCost web service.<br>2. DCIM answers. |
| Assumptions | UCSM implements use of DCIM GetEmptySlotPowerCost web service. |
| Notes | The concept of power cost of an empty slot is different from the concept of the best server to be turned on/off at the moment.<br>Though both require analysis of power and cooling availability, the first deals with a more static view (nameplate values) and strategic planning of new blade/servers installation based on datacenter policies in order to maximize the utilization of datacenter resources, while the second is a dynamic view of datacenter resource utilization and best options given the current server/blade population.<br>FD-QUERY-03    Cisco Web Services shall implement GetEmptySlotPowerCost service where DCIM computes power cost for a given list of empty slots on a number of UCS Chassis. To compute the power cost of empty slots DCIM needs at least to consider the nameplate values of installed equipment (see Notes and Issues above). |

FIGURE 16M

| *UCSM queries environmental datacenter information (UC-QUERY-04)* ||
|---|---|
| Description | UCSM queries DCIM about environmental datacenter information for a list of UCS devices. |
| Trigger | UCSM user navigates to a page where environmental information is displayed. |
| Actors | UCSM, Cisco Web Services, MSS Web Services, Cisco Application, Operations Application, CPS Services. |
| Pre-Conditions | UCS infrastructure representation exists in the CDMR. |
| Post-Conditions | Success end condition<br>DCIM answers adding environmental information to the list of UCS devices.<br>Failure end condition<br>DCIM cannot compute the list and signals that the query has failed.<br>Minimal Guarantee<br>DCIM provides UCSM an indication about the result of the query operation. |
| Main Flow | 1. UCSM uses GetEnvironmentalData web service.<br>2. DCIM answers. |
| Assumptions | UCSM implements use of DCIM GetEnvironmentalData web service. |
| Notes | The environmental data that DCIM can offer to UCSM are any measurement and sensor state related to rack or isle conditions, the power consumption as measured by power strips, etc.<br>FD-QUERY-04    Cisco Web Services shall implement GetEnvironmentalData service where DCIM identifies relevant environmental information related to each UCS device on a given list (see Notes and Issues above).<br>FD-QUERY-05    Cisco Application, Operations Application and CPS Services shall coordinate to get TSD information |

FIGURE 16N

DCIM receives UCS notifications (UC-RCV-NOTIF-01)

| | |
|---|---|
| Description | DCIM receives UCS notifications via traps and/or XML API. |
| Trigger | Internal UCSM event. |
| Actors | UCSM, Cisco Element Library, MSS Services. |
| Pre-Conditions | UCS infrastructure representation exists in the CDMR. |
| Post-Conditions | Success end condition<br>DCIM receives notifications and updates CDMR or TSD as needed.<br>Failure end condition<br>Notification cannot be processed and the error condition is logged.<br>Minimal Guarantee<br>The minimal guarantee is the same as the success end condition. |
| Main Flow | 1. UCSM sends SNMP trap.<br>2. DCIM receives and process it. |
| Alternate Flows | 1. UCSM sends XML API notification.<br>2. DCIM receives and process it. |
| Assumptions | None. |
| Notes | • About the IP source address for the SNMP trap, several agents may be involved (inside the UCS fabric) to generate the trap. This may involve the address of each Fabric Interconnect (the one running at the moment) or even the address of other UCS devices (in the case the utility OS of a blade generates its own traps).<br>• Every single change in UCSM internal objects will be reported and DCIM will implement needed some sort of filtering.<br>FD-RCV-NOTIF-01    Cisco Element Library shall implement the ability to decode UCS SNMP traps and/or subscribe and receive UCSM XML notifications using XML API (see Notes and Issues above).<br>FD-RCV-NOTIF-02    Cisco Element Library shall coordinate with MSS Services to update CDMR or TSD information. |

FIGURE 16O

DCIM monitors UCSM data points (UC-STAT-01)

| Description | DCIM monitors UCSM data points using XML API. |
|---|---|
| Trigger | Scheduled action on Cisco Element Library or UCSM. |
| Actors | Cisco Element Library, UCSM, MSS Services. |
| Pre-Conditions | UCS infrastructure representation exists in the CDMR. |
| Post-Conditions | Success end condition<br>DCIM periodically updates UCSM data points in TSD.<br>Failure end condition<br>DCIM fails to obtain UCSM data points for this collection cycle and the error condition is logged.<br>Minimal Guarantee<br>The minimal guarantee is the same as the success end condition. |
| Main Flow | 1. Cisco Element Library polls UCSM for data points.<br>2. Data points are stored in TSD. |
| Alternate Flows | 1. UCSM sends data points to DCIM.<br>2. Data points are stored in TSD. |
| Assumptions | None. |
| Notes | FD-STAT-01  Cisco Element Library shall implement the ability to poll or receive data points using XML API (see Notes and Issues above).<br>FD-STAT-02  Cisco Element Library shall coordinate with MSS Services to update TSD information for the collected data points. |

FIGURE 16P

DCIM communicates critical conditions to UCSM (UC-SND-NOTIF-01)

| | |
|---|---|
| Description | DCIM communicates UCSM about critical operational conditions using XML API. |
| Trigger | DCIM detects critical condition for UCS infrastructure based on evaluation of internal or user-defined rules. |
| Actors | CPS Services, Cisco Application, Cisco Element Library, UCSM. |
| Pre-Conditions | UCS infrastructure representation exists in the CDMR. |
| Post-Conditions | Success end condition<br>DCIM successfully calls UCSM and logs critical condition.<br>Failure end condition<br>DCIM fails to communicate with UCSM and the error condition is logged.<br>Minimal Guarantee<br>The minimal guarantee is the same as the success end condition. |
| Main Flow | 1. Rules evaluation triggers UCSM notification.<br>2. Critical condition is communicated to UCSM. |
| Assumptions | • UCSM offers API for DCIM notifications. |
| Notes | The rules referred in this use case will include monitoring datacenter ecosystem parameters such as:<br>• power and cooling availability (including predictions when a UPS is running on batteries);<br>• environmental conditions (temperature, humidity, open door, etc) that poses risk due to tolerance or utilization policy of a certain UCS device.<br>FD-SND-NOTIF-01 CPS Services shall support rules evaluation that correlates data on the TSD (and possibly CDMR) in order to automatically identify critical operational conditions to UCS infrastructure (see Notes and Issues above). |

FIGURE 16Q

| | MODEL_INFO | TYPE |
|---|---|---|
| UCS 6120XP | UCS 6120XP | Fabric Interconnect |
| UCS 6120XP-FAN | UCS 6120XP-FAN | Fan Module |
| UCS 6140XP | UCS 6140XP | Fabric Interconnect |
| UCS 6140XP-FAN | UCS 6140XP-FAN | Fan Module |
| UCS 5108 | N20-C6508 | Blade Server Chassis |
| UCS 5108 FAN MODULE | UCS 5108 FAN MODULE | Fan Tray |
| UCS 2104XP | N20-I6584 | Fabric Extender |
| UCS B200 M1 | N20-B6620-1 | Half-width Blade Server |
| UCS B200 M2 | N20-B6625-1 | Half-width Blade Server |
| UCS B250 M2 | N20-B6625-2 | Full-width Blade Server |
| UCS B440 M1 | UCS B440 M1 | Full-width Blade Server |
| UCS C200 M1 | R200-1120402 | Rack Server |
| UCS C210 M1 | UCS C210 M1 | Rack Server |

FIGURE 19

Use Case List

| Use Case ID | Use Case Name | Primary Actor |
|---|---|---|
| 0001 | Steps for Provisioning new Hardware into ESX Clusters, and into the Physical Infrastructure. | IT Technician, IT Capacity Planner |
| 0002 | Steps for Provisioning new VMs into Clusters, Accounting for Conditions in the Physical Infrastructure. | IT Technician, IT Capacity Planner |
| 0003 | Automation for Dynamically Deciding the Power- and-Cooling-Appropriate location for a VM. | IT Technician |
| 0004 | Steps for Rebalancing of VMs Based on Changing Physical Conditions, or Changes in Data Center Policies – affects Migration Recommendation in VMware systems. | IT Technician |
| | | |

FIGURE 20

Use Case(s)

| Use Case ID: | 0001 | | |
|---|---|---|---|
| Use Case Name: | Steps for Provisioning new Hardware into ESX Clusters, and into the Physical Infrastructure. | | |
| Revision: | 3.0 | | |
| Created By: | Arnaldo Zimmermann | Last Updated By: | Arnaldo Zimmermann |
| Date Created: | 06/16/2010 | Date Last Updated: | 06/18/2010 |

| | |
|---|---|
| Actors: | IT Technician, IT Capacity Planner |
| Description: | An IT Technician or planner wants to install a new server for ESX within a VMware cluster in the data center.<br>He or she needs to know the optimal location based on real-time resource availability (physical space in the rack, power, cooling, network and storage), cluster requirements (storage accessibility, processor compatibility and networking infrastructure), data center layout and policies (power budget, power redundancy, hot spots and dynamic cooling environment). |
| Trigger: | Need to expand data center computing capacity. |
| Pre-conditions: | 1. Purchase the server hardware required to run ESX.<br>2. Have VMware (vSphere, vCenter...) and Data Center Infrastructure Management (DCIM) apps managing the data center.<br>3. Have a VMware cluster. |
| Post-conditions: | The server is installed in a known location and ready to be used. |

FIGURE 21A

| | |
|---|---|
| Steps for Normal Flow: | 1. From vSphere, select a cluster and go to a pre-written DCIM plug-in interface operating in sphere.<br>2. Select 'Add New Hardware'.<br>3. Look up and select the new server's hardware profile, which includes size, weight, max power consumption, operating temperature range.<br>4. DCIM plug-in will use the DCIM to do real-time search[1] and recommend the suitable racks where the server can be installed based on the combined hardware profile, cluster requirements (storage accessibility, processor compatibility and networking infrastructure), data center layout and policies (power budget, power redundancy, hot spots and dynamic cooling environment).<br>5. Select the desired place and request server installation with the final requirements. An installation ticket will be created.<br>6. After physical installation, a notification will be sent out informing about the server availability in the network and DCIM will be updated.<br>7. IT Technician can then complete the VMware ESX server installation. |
| Steps for Alternative Flow(s): | 1. From vSphere, go to DCIM plug-in interface.<br>2. Look up for suitable racks based on individual or any combination of power, cooling, space, clustering, networking or storage.<br>3. DCIM plug-in will go out to the DCIM and do a real-time search[1] and show the suitable racks where the server can be installed.<br>4. Select the desired place and request server installation with the final requirements. An installation ticket will be created.<br>5. After physical installation, a notification will be sent out informing about the server availability in the network and DCIM will be updated.<br>6. IT Technician can then complete the VMware ESX server installation. |
| Exceptions: | 1. If there is no record for such a new hardware, fill in the information from the machine's nameplate. This must include size, weight, max power consumption, operational temperature range. |
| Includes: | |
| Priority: | |
| Frequency of Use: | Every time a new server is installed in the data center. |
| Business Rules: | |
| Non-Functional Requirements: | |

FIGURE 21B

| Assumptions: | |
| --- | --- |
| Notes and Issues: | Note:<br>(1) DCIM apps use continuous real-time dynamic measurements (data points) collected from the data center to report the actual power and cooling usage, instead of relying on peak capacity provided on static nameplate ratings.<br>Risk of over-subscription can be mitigated by dynamic power management and power capping. DCIM allows defining policies for power and temperature capping at rack or server level.<br><br>VMware clustering recommendation:<br>*"When deciding which hosts to group into a DRS cluster, try to choose hosts that are as homogeneous as possible, in terms of CPU, memory, and storage, to allow the most flexible management of resources."* |

FIGURE 21C

| Use Case ID: | 0002 |
|---|---|
| Use Case Name: | Steps for Provisioning new VMs into Clusters, Accounting for Conditions in the Physical Infrastructure. |
| Revision: | 3.0 |
| Created By: | Arnaldo Zimmermann | Last Updated By: | Arnaldo Zimmermann |
| Date Created: | 06/16/2010 | Date Last Updated: | 06/18/2010 |

| Actors: | IT Technician, IT Capacity Planner |
|---|---|
| Description: | Whenever an IT Technician or planner wants to add new VMs to a cluster, he or she wants to have the VMs installed on a host based on real-time resource availability (power, cooling, CPU, memory, networking and storage) and also in accordance with data center layout and policies (power budget, power redundancy, hot spots and dynamic cooling environment). |
| Trigger: | Need to deploy a new VM. |
| Pre-conditions: | 1. Cluster or ESX server already running.<br>2. Have VMware (vSphere, vCenter, ...) and Data Center Infrastructure Management (DCIM) plug-in and apps managing the data center. |
| Post-conditions: | VM cluster |
| Steps for Normal Flow: | 1. In vSphere request a new VM to be build in a cluster.<br>2. DCIM plug-in[1] enable the DCIM to interact with DRS to provide DRS with real-time power, cooling data, network and memory resource availability taking into account power budget and power redundancy policies, hot spots and dynamic cooling environment.<br>3. DRS "best fit" algorithms are enhanced to incorporate DCIM environmental/physical data to determine the most appropriate destination for the new VM.<br>4. VM is built in the selected Host. |
| Steps for Alternative Flow(s): | |
| Exceptions: | |

FIGURE 22A

| | |
|---:|:---|
| Includes: | |
| Priority: | |
| Frequency of Use: | Ever time new VMs are deployed |
| Business Rules: | |
| Non-Functional Requirements: | |
| Assumptions: | |
| Notes and Issues: | Note:<br>(1) DCIM apps use continuous real-time dynamic measurements (data points) collected from the data center to report the actual power and cooling usage, instead of relying on peak capacity provided on static nameplate ratings.<br>Risk of over-subscription can be mitigated by dynamic power management and power capping. DCIM allows defining policies for power and temperature capping at rack or server level. |

FIGURE 22B

| Use Case ID: | 0003 |
|---|---|
| Use Case Name: | Automation for Dynamically Deciding the Power-and-Cooling-Appropriate location for a VM. |
| Revision: | 3.0 |
| Created By: | Arnaldo Zimmermann | Last Updated By: | Arnaldo Zimmermann |
| Date Created: | 06/16/2010 | Date Last Updated: | 06/18/2010 |

| Actors: | IT Technician |
|---|---|
| Description: | An IT Technician wants to relocate all the VMs on an ESX server host for maintenance purpose.<br>He or she wants to have the VMs migrated to other hosts in accordance with power, cooling, CPU, memory, networking and storage policies, so the server can undergo maintenance. |
| Trigger: | Scheduled maintenance on a running ESX server. |
| Pre-conditions: | 1. Additional ESX servers already exist within a cluster.<br>2. Have VMware (vSphere, vCenter, ...) and Data Center Infrastructure Management (DCIM) apps managing the data center. |
| Post-conditions: | The VMs are moved to other ESX servers. The ESX server is ready for maintenance. |
| Steps for Normal Flow: | 1. From vSphere, select the appropriate ESX server host and choose "Enter Maintenance Mode".<br>2. DCIM plug-in[1] uses the DCIM to interact with DRS to provide DRS with real-time power, cooling data, network and memory resource availability taking into account power budget and power redundancy policies, hot spots and dynamic cooling environment.<br>3. DRS "best fit" algorithms are enhanced to incorporate DCIM environmental/physical data to determine the most appropriate hosts to vMotion the VMs located in the host that needs to undergo maintenance.<br>4. Upon completion of the VMs migration, the selected Host enters "maintenance mode" at which time the Host may be powered down, patched, reboot etc. |

FIGURE 23A

| Steps for Alternative Flow(s): | |
|---|---|
| Exceptions: | |
| Includes: | |
| Priority: | |
| Frequency of Use: | Every time an ESX Host is put into Maintenance Mode |
| Business Rules: | |
| Non-Functional Requirements: | |
| Assumptions: | |
| Notes and Issues: | Note:<br>(1) DCIM apps use continuous real-time dynamic measurements (data points) collected from the data center to report the actual power and cooling usage, instead of relying on peak capacity provided on static nameplate ratings.<br>Risk of over-subscription can be mitigated by dynamic power management and power capping. DCIM allows defining policies for power and temperature capping at rack or server level. |

FIGURE 23B

| Use Case ID: | 0004 |
|---|---|
| Use Case Name: | Steps for Rebalancing of VMs Based on Changing Physical Conditions, or Changes in Data Center Policies – affects Migration Recommendation in VMware systems. |
| Revision: | 1.0 |
| Created By: | Arnaldo Zimmermann | Last Updated By: | |
| Date Created: | 06/18/2010 | Date Last Updated: | |

| Actors: | IT Technician |
|---|---|
| Description: | IT technician wants to make use of real-time data center ecosystem resource availability in accordance with data center layout and policies (power budget, power redundancy, hot spots and dynamic cooling and humidity environment) to enhance the VM migration recommendation used by DRS to dynamically allocate and balance computing resources, while avoiding services disruption. |
| Trigger: | Crossing power load, temperature, humidity or storage threshold levels based on data center policies. |
| Pre-conditions: | 1. VMware Cluster already running.<br>2. Have VMware (vSphere, vCenter, ...) and Data Center Infrastructure Management (DCIM) plug-in and apps managing the data center. |
| Post-conditions: | VM cluster expanded or consolidated. |
| Steps for Normal Flow: | 1. In vSphere, select cluster, enable DRS and configure the desired automation level.<br>2. DCIM plug-in[1] interacts with DRS, providing DRS with real-time power and cooling data availability taking into account power budget and power redundancy policies, hot spots and dynamic cooling and humidity environment. Migration thresholds and policies are configured from DCIM plug-in interface.<br>3. DRS dynamic rebalancing algorithm is enhanced to incorporate DCIM VM migration recommendations based on real-time power, cooling and humidity data. DPM is enhanced to make use of DCIM outlet metering and outlet switching capabilities to go beyond "wake on LAN" power management.<br>4. VMs are migrated. |
| Steps for Alternative Flow(s): | |

FIGURE 24A

| | |
|---:|:---|
| Exceptions: | |
| Includes: | |
| Priority: | |
| Frequency of Use: | Ever time new VMs are deployed |
| Business Rules: | |
| Non-Functional Requirements: | |
| Assumptions: | |
| Notes and Issues: | Note:<br>(1) DCIM apps use continuous real-time dynamic measurements (data points) collected from the data center to report the actual power and cooling usage, instead of relying on peak capacity provided on static nameplate ratings.<br><br>Risk of over-subscription can be mitigated by dynamic power management and power capping. DCIM allows defining policies for power and temperature capping at rack or server level.<br><br>Examples of ecosystem parameters when DCIM is recommending the VM migration:<br>• An infrastructure (power or cooling) alarm or unit failure may not impact operation due to redundancy, but the user is now at risk due to a reduction in availability.<br>• Temperature, humidity risks due to out of tolerance for devices specific requirements<br>• Current load has fallen to the point where an entire zone (power or cooling) can be vacated and equipment moved to standby.<br>• Power rate changing<br>    ▪ power rates changing during certain times of the day.<br>    ▪ experience power constraints, engage alternative energy source.<br>    ▪ run non-time sensitive VM workload (batch process)<br>    ▪ move load to different location |

FIGURE 24B

INFRASTRUCTURE CONTROL FABRIC SYSTEM AND METHOD

CROSS-REFERENCE TO RELATED APPLICATIONS

This application claims the benefit of U.S. Provisional Application No. 61/441,131 filed on Feb. 9, 2011 and U.S. Provisional Application No. 61/469,357 filed on Mar. 30, 2011. The disclosures of the above applications are incorporated herein by reference.

FIELD

The present disclosure relates to data center infrastructure management systems and methods, and more particularly to a data center infrastructure management system and method that is able to monitor an operation and configuration of a specific data center component. More specifically the present disclosure relates to a data center infrastructure control fabric system and method that is able to communicate directly with a specific data center component, in real time, to inform the component whether a proposed configuration or operational change to the component can be accommodated in view of other data center operational factors.

BACKGROUND

This section provides background information related to the present disclosure which is not necessarily prior art.

In modern day datacenters, the static nature of the physical infrastructure (e.g., power availability, cooling capacity and space constraints) and the inherently dynamic nature of information technology ("IT") workloads have created a data center environment in which significant inefficiencies can often exist. Addressing these inefficiencies would allow the operators of data centers to increase the capacity utilization of their infrastructure and to decrease the overall power consumption. However, the challenge up to the present time has been the inability to dynamically change the physical capacity (e.g., power and/or cooling capacity) associated with the datacenter in accordance with the IT load being experienced at any given time.

Due to the static nature of the infrastructure, IT workloads are typically given a safety margin within which they operate. With reference to FIG. 10, this means that there will always be at least some degree of available capacity that is not being used. If the IT workload starts getting too close to capacity, the infrastructure is upgraded with additional capacity, which is invariably a capital-intensive exercise. From a cost standpoint, then, the present approach of providing a "safety margin" for power and cooling needs can mean significant added expense for an entity. This is because there are often significant stretches during a twenty four hour period where various IT components are operating at less than maximum capacity or are inactive entirely. However, modern day data centers typically must still provide enough additional power and cooling capacity to meet the maximum anticipated workloads of the various IT components.

With reference to FIG. 11, in an ideal environment the IT components and the facilities infrastructures (e.g., presently available cooling capacity; presently available unused power and presently available rack space) will be in constant communication through some physical data center management infrastructure. The physical infrastructure would monitor the IT equipment and adjust capacities accordingly. The data center management infrastructure would also be able to cap the amount of resources used by IT equipment when the workload of an IT component exceeds a maximum overall capacity of the installation. However, a situation may still exist where an application requests a specific IT component (e.g., server) to begin performing a task that will be likely (or certain) to cause an infrastructure resource, such as power or cooling, to be exceeded. Put differently, a situation may still exist where a specific IT device, itself, does not have specific information on the data center resources available for use before beginning a user commanded operation or task. This can result in at least one of power or cooling capacities in the data center environment to be exceeded as the specific IT device begins the commanded operation or task. When power or cooling capacities are exceeded, this may necessitate the data center management system limiting or curtailing the use of other IT devices when the data center resources are exceeded. Thus, having the specific IT device begin taking its requested action without first checking on the availability of data center resources may cause an undesirable change in the overall dynamics of the data center ecosystem. This is especially so in a typical, large scale dynamic IT environment, where equipment is being commissioned and decommissioned frequently to address varying business IT needs. Every change carries an intrinsic risk. As a result, the dynamics of IT loads and the static nature of physical infrastructure often forces datacenters to operate at a safe distance from full power and cooling capacities (i.e., with substantial spare capacities) to ensure that data center resource requirements are able to be met at all times.

SUMMARY

In one aspect the present disclosure relates to a data center infrastructure management (DCIM) system having an infrastructure control fabric (ICF) subsystem. The ICF subsystem enables a manager component of an independent computing device to communicate directly with the DCIM system. In one embodiment the DCIM system may include a manageability subsystem engine for monitoring data being transmitted from the independent computing device. A domain model may be included that includes an extension relating to information on the independent computing device, and a services server may be included for providing a shared services infrastructure layer. The ICF subsystem may include components located in at least one of the manageability subsystem engine, the domain model, on the services server, and in the manager component of the independent computing device, to enable the independent computing device to directly query the DCIM system. The independent computing device may thus communicate directly with the DCIM system to obtain at least one of real time power, cooling and space information that is useful for the independent computing device to know before at least one of initiating an operation or continuing with an operation.

In another aspect the present disclosure relates to a method for enabling a data center infrastructure management (DCIM) system to communicate directly, and in real time, with an independent computing device through a manager component of the independent computing device. The method may include using an infrastructure control fabric (ICF) subsystem for enabling the manager component of an independent computing device to communicate directly with a DCIM system. An element library may be located in a specific subsystem of the DCIM system, wherein the element library has information on the independent computing device. The element library may be used to assist in enabling the independent computing device to directly query the DCIM system to obtain at least one of real time power, real time cooling, and space information that is useful for the independent computing device to know before at least one of initiating an operation or continuing with an operation.

In still another aspect the present disclosure relates to a method for enabling a data center infrastructure management (DCIM) system to communicate directly, and in real time, with an independent computing device through a manager component of the independent computing device. The method may include using an infrastructure control fabric (ICF) subsystem for enabling the manager component of an independent computing device to communicate directly with a DCIM system. A manageability subsystem engine of the DCIM system may be used for monitoring data being transmitted from the independent computing device. A domain model of the DCIM system may be used which includes an extension, where the extension includes information concerning the independent computing device. A manageability subsystem of the DCIM system may be used to receive information from the independent computing device, and a services server of the DCIM system may be used for providing a shared services infrastructure layer. Components of the ICF subsystem may be located in each of the manageability subsystem engines, the domain model, on the services server, and in the manager component of the independent computing device. This enables the independent computing device to directly query the DCIM system to obtain at least one of real time power, real time cooling, and space information that is useful for the independent computing device to know before at least one of initiating an operation or continuing with an operation.

Further areas of applicability will become apparent from the description provided herein. It should be understood that the description and specific examples are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

The drawings described herein are for illustrative purposes only of selected embodiments and not all possible implementations, and are not intended to limit the scope of the present disclosure.

FIGS. 13A and 13B illustrate a use table listing various use scenarios involving the DCIM system and the Cisco UCS;

FIGS. 16A-16Q illustrate tables summarizing operational details of the various use scenarios listed in the table of FIG. 13;

FIG. 19 is a table forming an example of various symbols that are presently available for the UCS;

FIG. 20 is a chart illustrating four exemplary use cases where the DCIM may be implemented in connection with one or more components manufactured by VMware, Inc.;

FIGS. 21A-21C show a table setting forth operations in implementing the first use case of FIG. 20, and more specifically operations in which the DCIM is used for provisioning new VMware, Inc. hardware into ESX clusters and into the physical infrastructure of a data center;

FIGS. 22A and 22B show a table setting forth operations in implementing the second use case of FIG. 20, and more specifically provisioning new VMware servers into clusters, while taking into account conditions in the data center;

Figure 1:
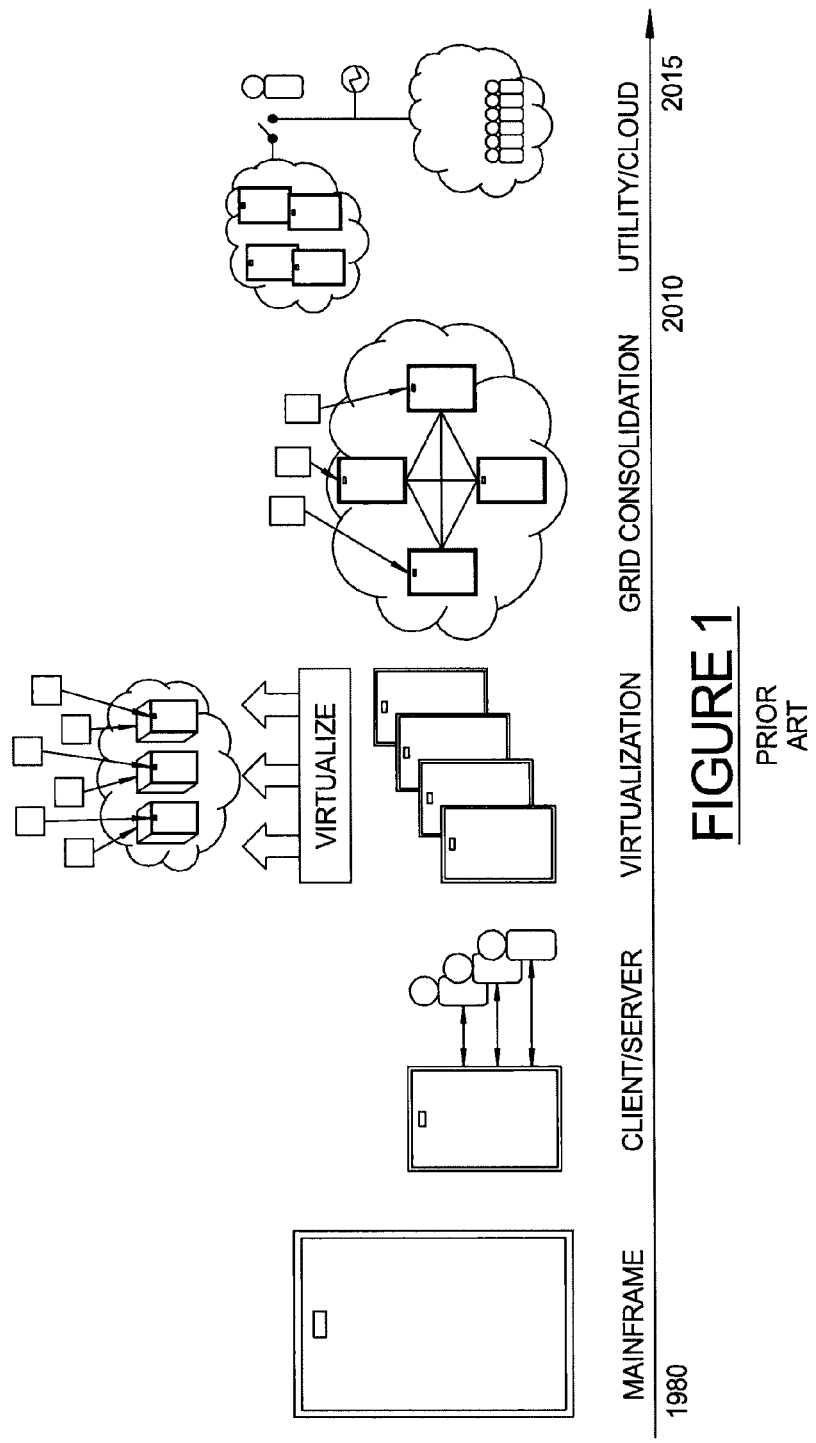
FIG. 1 is a prior art, high level representation of changes that the common data center model has progressed through since its origins in mainframe computing.
Figure 2:
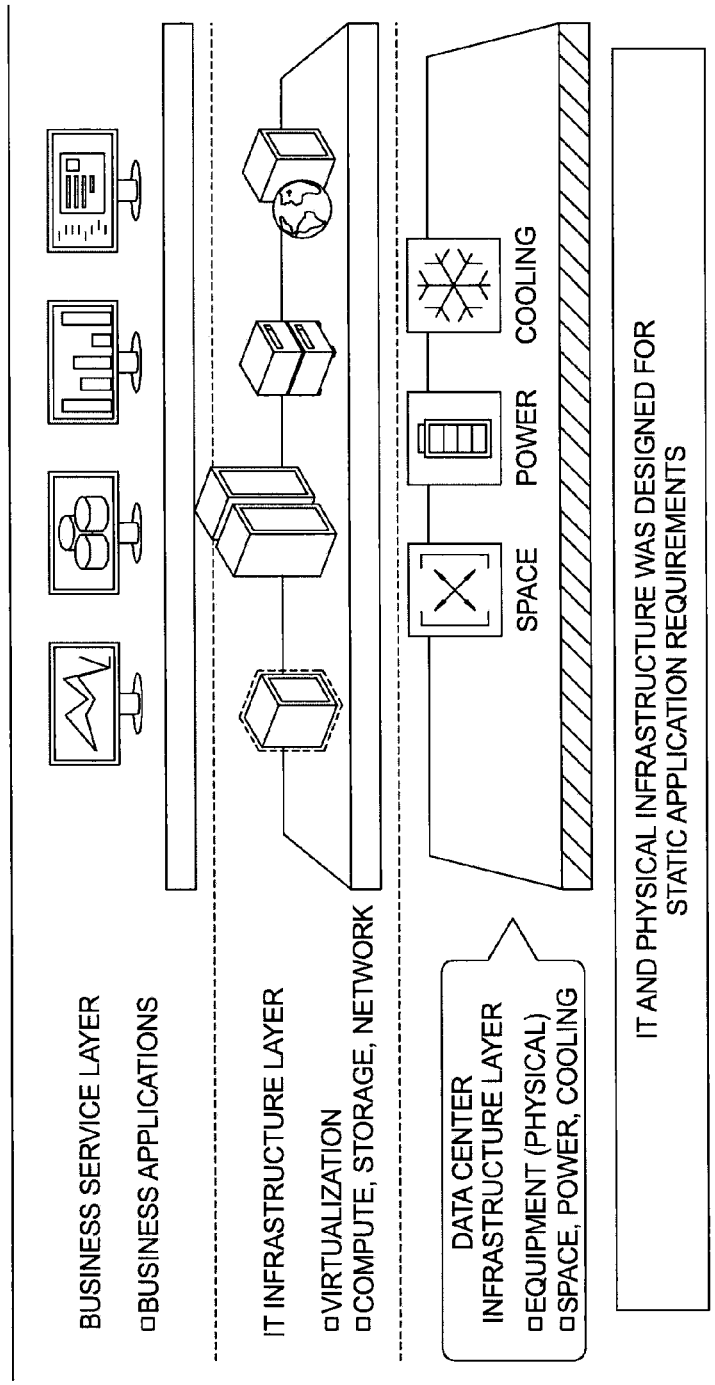
FIG. 2 is a high level representation of one example of the various components that may be used in the various functional layers of a typical, prior art, existing data center.

FIGS. 23A and 23B show a table setting forth operations in implementing the third use case of FIG. 20, and more specifically operations in dynamically deciding an optimum power and cooling appropriate location for locating a new VM (virtual machine); and FIGS. 24A and 24B show a table setting forth operations in implementing the fourth use case in FIG. 20, and more specifically operations in rebalancing of VMs based on changing physical conditions or changes in data center policies which affect a migration recommendation in VMware systems.

DETAILED DESCRIPTION

DCIM Appliance and DRIP (Hardware)

Example embodiments of a Data Center Infrastructure Management (hereinafter "DCIM") Solution 10 will now be described more fully with reference to the accompanying drawings.

Overview

This section provides a general summary of the disclosure, and is not a comprehensive disclosure of its full scope or all of its features. The DCIM Solution 10 is a modularly expandable family of hardware and software products that are designed to manage all the elements of a datacenter from a central location. In particular, the DCIM Solution 10 includes one or more DCIM hardware appliances (hereinafter simply the "DCIM Appliances") and a suite of software products (hereinafter the "DCIM Software Suite"). The DCIM Solution has the capability to manage Microsoft Windows® servers, Linux® servers, UNIX® servers, storage and serial devices, service processors, rack/environmental sensors, data center power units, cooling units, and power distribution units (PDUs), with all data being gathered by a common collection engine. It allows data center operators to have full access to monitor and control every piece of equipment in the data center.

Until now, to manage a data center, multiple point solutions have been needed. The DCIM Solution 10 brings all of these point solutions into a single product suite. Previously, a plurality of independent hardware devices have been required, such as remote access application and associated hardware such as Avocent's KVM appliance to manage Windows® servers; the Avocent® Advanced Console Server (ACS) to manage Linux®/UNIX® servers, serial devices and iPDU; the Avocent® MergePoint™ Service Processor Manager; the Liebert® Rack Data Unit (RDU) to manage rack and environmental sensors, and the Liebert® SiteLink™ communications interface. Previously, a plurality of independent software applications have also been typically been required, such as: the Avocent® MergePoint Infrastructure Explorer data center management software; the Liebert® SiteScan Web centralized monitoring and control system; Emerson Network Power ASCO PowerQuest™ power interface software to monitor power and cooling equipment; and the Aperture® Vista enterprise software solution. By consolidating multiple software appliances into the consolidated software platform that forms the DCIM Software Suite of the DCIM Solution 10, and multiple hardware appliances into the aggregated DCIM hardware appliance, the DCIM Solution 10 not only frees up physical space on an equipment rack, but the operator's span of control of the data center is enhanced. This allows the data center manager to even more effectively manage and control servers and other computing/storage devices, power equipment, and cooling systems to optimize performance and energy usage.

In addition to the obvious benefits that the DCIM Appliances provide, the DCIM Software Suite makes managing the datacenter easier and even more efficient than what was previously possible. The software modules that comprise the DCIM Software Suite may run on a common host server apart from the DCIM Appliances and may work to provide a complete and accurate view of the data center, while still allowing the user to manage and control every aspect of the data center. The host server receives data from all of the DCIM Appliances throughout the data center via their Manageability Subsystem (MSS) collection engines. By using the DCIM Software Suite modules, the data center manager can tap into the real-time data, view reports, and manage the devices remotely from a rich, web-based, graphical user interface ("GUI").

It should also be noted that the DCIM Appliances and the DCIM Software Suite can be implemented separately and scaled to fit a user's need. By implementing the DCIM Appliances on their own, the user can still access the DCIM Appliances remotely, and therefore access the devices connected to them as well. However, the user would not benefit from the reports and enhanced management abilities that the DCIM Software Suite provides. Likewise, the DCIM Software Suite can be implemented in the data center without the DCIM Appliances, although without the physical connectivity provided by the DCIM Appliances, real-time data collection, monitoring and control are not supported.

DCIM Appliance and DRIP (Hardware)

Figure 3:
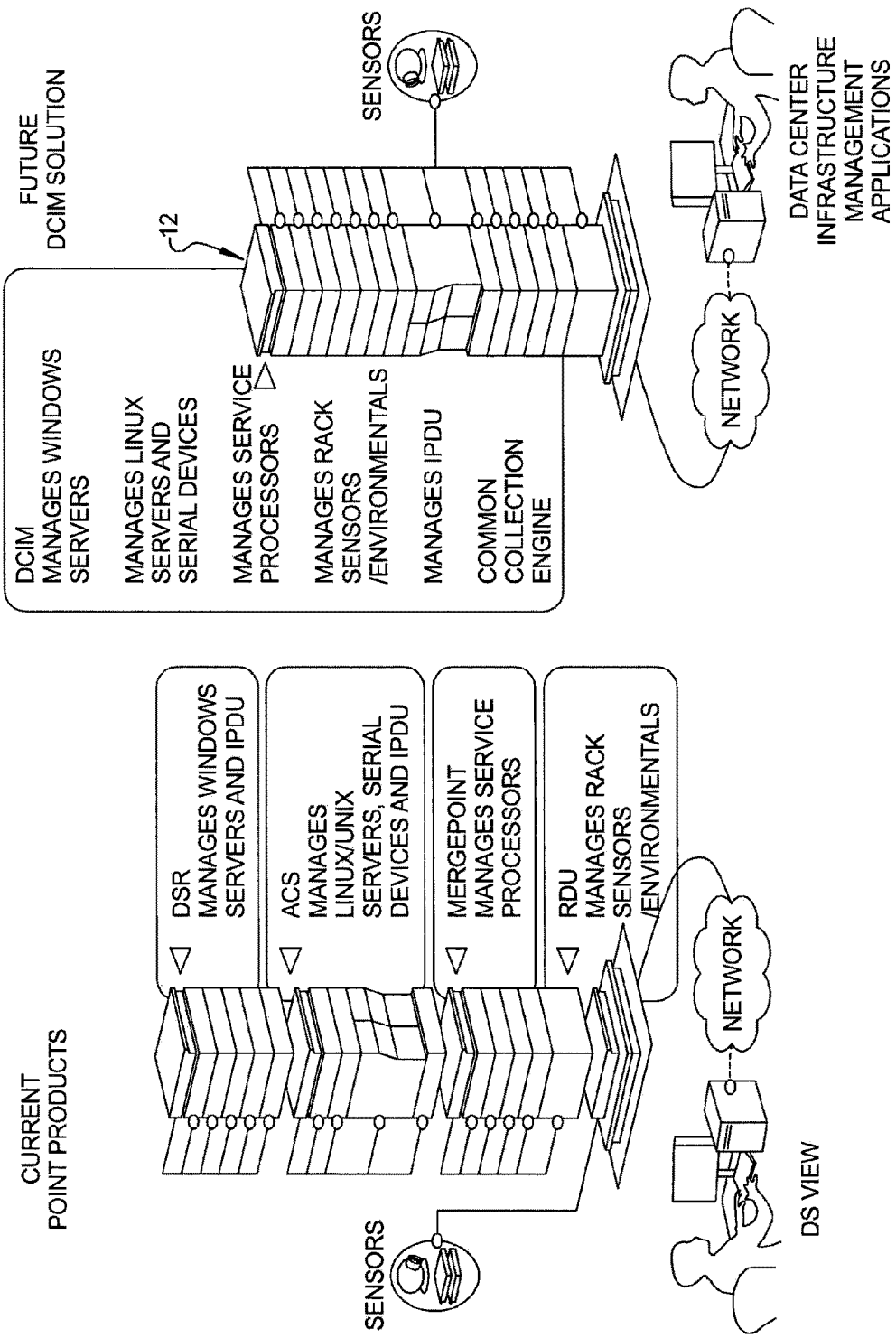
FIG. 3 is a high level representation of one example of a single DCIM Appliance in accordance with the present disclosure being used to perform the functions of a plurality of hardware devices.

A DCIM appliance 12 may comprise one or more hardware appliances that typically reside in selected equipment racks or that may be mounted on a wall within a datacenter. The arrangement of interfaces on the DCIM appliance 12 provides the user with access to various pieces of equipment for control and performance metric collection. As illustrated in FIG. 3, the single DCIM appliance 12 consolidates the functions of several previous products into one piece of hardware. The DCIM appliance 12 may replace the existing Avocent® DSR® switches, Avocent® Advance Console Server (ACS), MergePoint Service Process Manager, (SPM), and the Liebert® Rack Data Unit (RDU) products, and consolidate all of their functionality into one or more hardware appliances. A base embodiment, of the Appliance 12 termed the "DCIM SP", is targeted to replace the existing service process manager (SPM) hardware. The DCIM SP can have two specific port configurations, one with 24 IP ports and another with 40 IP. Both versions can include eight dedicated serial ports. For each, the IP ports can be isolated from the network interface ports and function as a layer two switch. This arrangement preserves the configuration of the current SPM. The numerous IP ports and the eight dedicated serial ports provide an appliance that can service an entire rack of service processors and also provide control of serial based switches and power strips in the rack. In addition to the two physical port SPM variants, there is a logical version that has only the main network ports and does not have any rear panel ports, the DCIM SP Logical.

In addition to the DCIM SP embodiment, the DCIM appliance 12 may have three higher-end embodiments labeled the "DCIM Branch 8", the "DCIM Entry", and the "DCIM Enterprise". This higher-end group of embodiments of the DCIM Appliance 12 provides auto-sensing ports that can automatically select between IP or serial connections. The DCIM Branch 8 does not have RDU connections while the DCIM Entry and DCIM Enterprise devices do. The RDU interfaces on the DCIM Entry and DCIM Enterprise appliances mimic the main connectivity of the RDU appliance and allow similar functions to be included on the higher-end DCIM devices. The higher-end DCIM appliance 12 embodiments may also have the ability to interface with an IQ module providing traditional KVM functionality. This IQ module, called a "Digital Rack Interface Pod" (DRIP), provides digitization of analog video along with keyboard and mouse control and virtual media access.

The key functions of the DRIP are:
Providing USB and PS/2 ports for device keyboard and mouse;
Digitizing analog video data and sending it to the DCIM Appliance;
Connecting to a server's Service Processor for transmitting IPMI data to the DCIM Appliance;
Enable access to virtual media; and
Enable Smart Card support.

In order to support the various hardware platforms, an appliance host software platform is provided. The appliance host platform may be based on the Linux® vServer patch and functions as an OS virtualized platform. This allows Linux® operating system based applications to run with minimal changes on top of the DCIM appliance 12 host platform. Building the DCIM appliance 12 in this manner minimizes the changes necessary to combine the individual technologies into a single appliance. It also facilitates groups being able to concentrate on their core function without needing to know the details of the DCIM appliance 12 host platform.

A highly desirable feature of the DCIM appliance 12 software architecture is that it makes the finished devices look like a single cohesive appliance, even though they may be constructed from several underlying disparate software applications. To achieve this, the host system may be set up to provide several system functions that provide a gateway between the external user and the internal guest applications. These include licensing, authentication, authorization and auditing (AAA), and user interfaces. These functions take the external input and map it on to the correct application without the user requiring any knowledge of the underlying architecture. For example when a user authenticates to the DCIM appliance 12 the AAA function may inform each of the guest applications that the user is valid. The user does not need to authenticate to each guest application. Additional host pieces may include things such as the Linux® kernel, base file system and hardware component driver support. Each of the DCIM appliance 12 may also host a manageability subsystem (MSS) software engine (to be discussed in connection with FIG. 5).

In summary, at least six different configurations for two DCIM platforms, platforms "A" and "B", are shown in the following table.

DCIM Software Suite

Figure 4A:
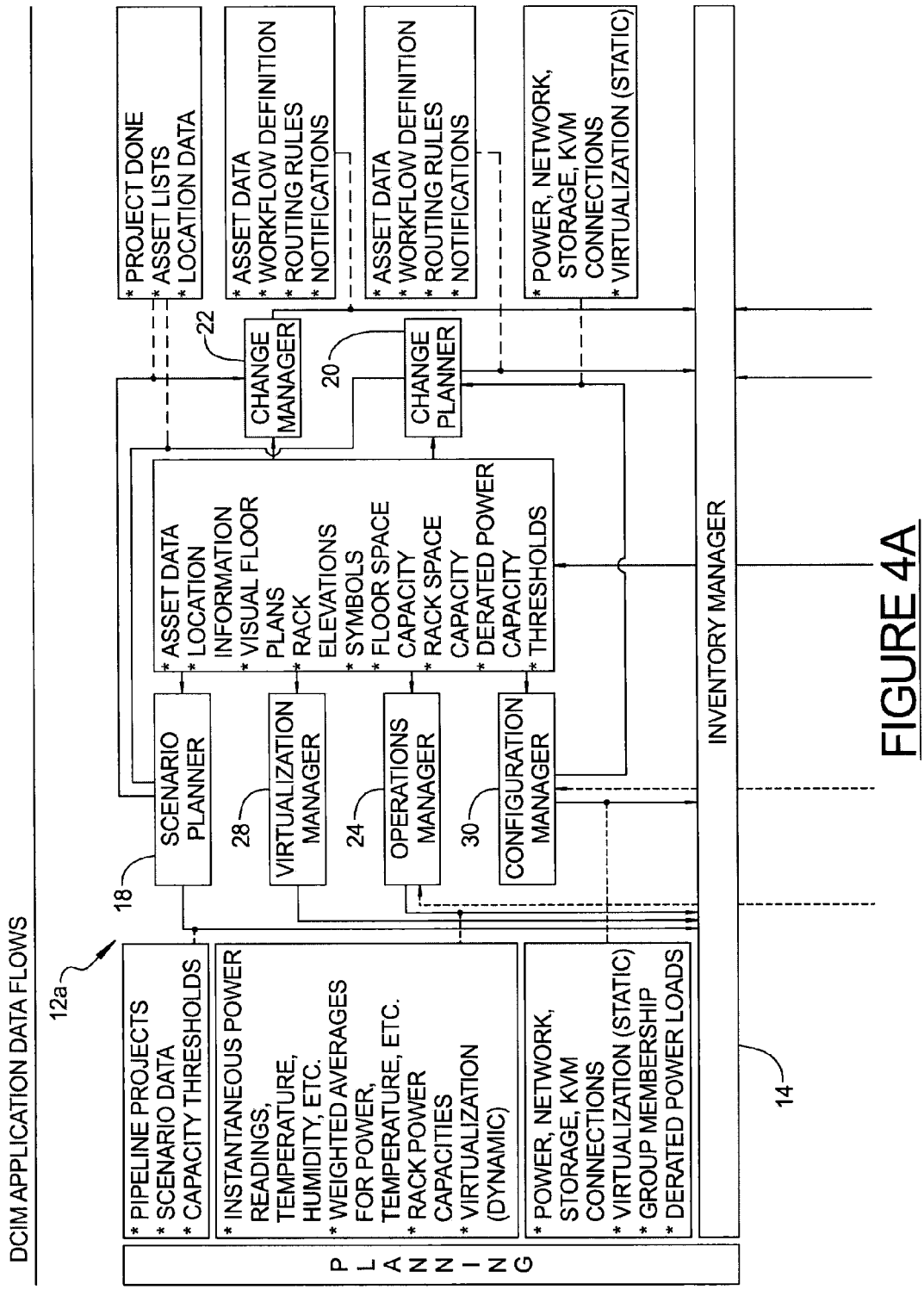
FIGS. 4A and 4B are a high level diagram of exemplary modules that may be used to form a DCIM Software Suite of one embodiment of a DCIM Solution of the present disclosure.
Figure 4B:
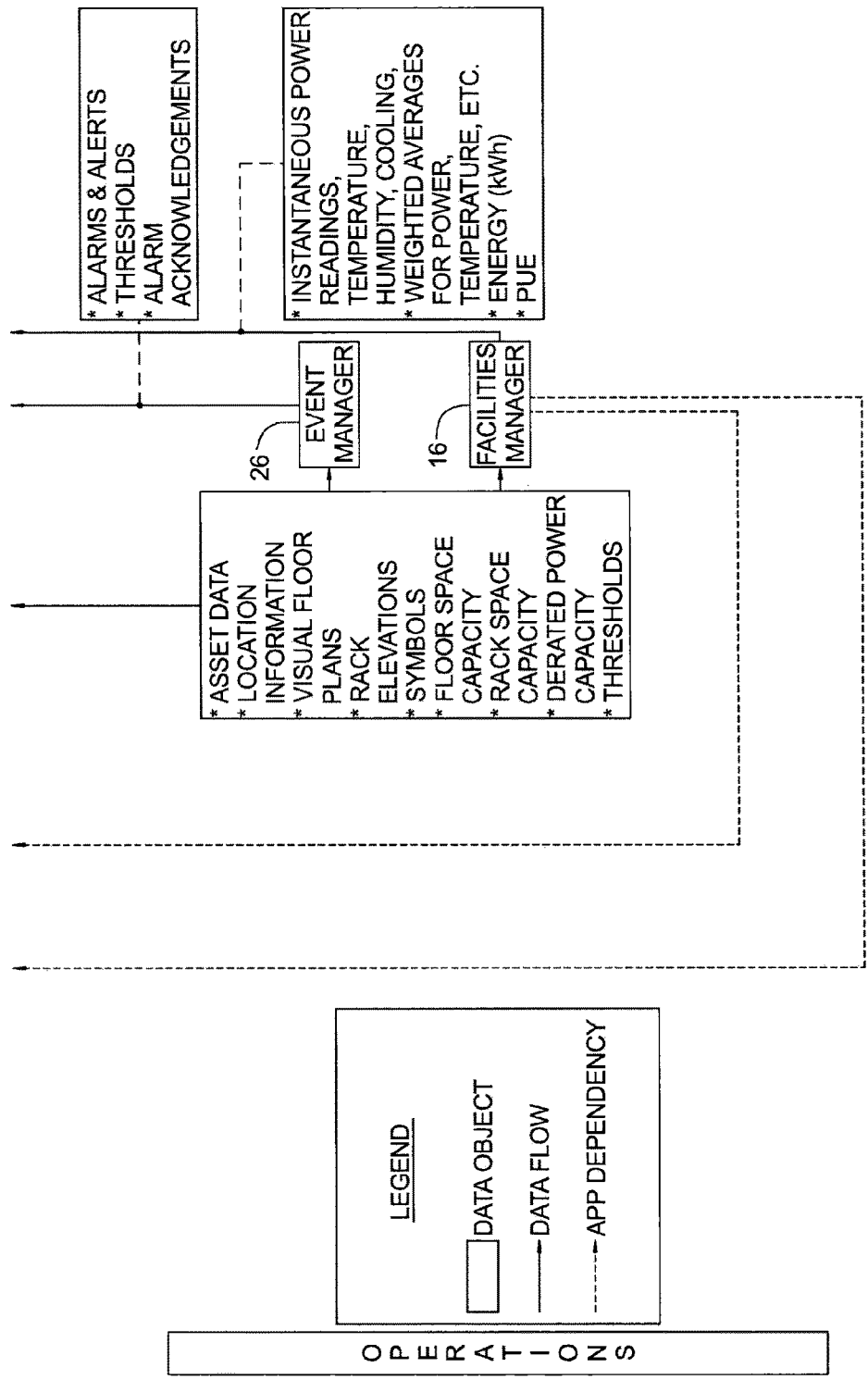

A DCIM Software Suite 12a of modules is modular, expandable and designed to make the operation, management, configuration or expansion of a datacenter seamless and simple. One example of the DCIM Software Suite 12a of modules is shown in FIGS. 4A and 4B and may include: an Inventory Manager 14, a Facilities Manager 16, a Scenario Planner 18, a Change Planner 20, a Change Manager 22, an Operations Manager 24, an Event Monitor 26, a Virtualization Manager 28 (and potentially a Rack Power Manager, and a Configuration Manager 30). These modules integrate seamlessly with one another and provide a rich user interface, with the ability to drag and drop items, show high-fidelity images of assets and reported data, and compile user-specific views with combinations of available facilities.

The DCIM Software Suite 12a is flexible enough to accommodate the preferences of the system administrator in a number of different areas, from the operating system and database to the web browser interface. The software modules can be installed on Microsoft® servers, Linux® servers, or Sun® servers, and possibly on other brands of servers. Microsoft® SQL and Oracle® databases are supported. To access the software modules, various commercially available operation systems and web browsers are supported.

For administrators who use existing products of Emerson Network Power or the Avocent® Corporation, for example the Aperture® Vista® data center resource management system, the Liebert® Site Scan® centralized monitoring and control system, or Avocent® MergePoint™ Infrastructure Explorer software (AMIE), the DCIM Software Suite 12a supports the migration of data. This data may include all assets and plan data, associated projects, and symbols libraries. The import may be manually triggered but will not necessitate the manual mapping of any asset, placement, plan or project data from AMIE to the modules of the DCIM Software Suite. The individual DCIM Software Suite 12a software modules are described in detail in the pages to follow.

DCIM Inventory Manager Module 14

The Inventory Manager module 14 manages DCIM records, which constitute the data center inventory of equipment. Often, data center managers and site technicians manage equipment lists through a variety of means such as spreadsheets, documents, drawing files, finance systems,

| | Platform | | | | | |
|---|---|---|---|---|---|---|
| Function | DCIM SP I | DCIM SP II | DCIM SP Logical | DCIM Branch 8 | DCIM Entry | DCIM Enterprise |
| Com Express | Atom D410 | Atom D410 | Atom D410 | Atom D410 | Atom D410 | i7-620LE |
| Memory | 4 GB DDR2 | 4 GB DDR2 | 4 GB DDR2 | 4 GB DDR2 | 4 GB DDR2 | 8 GB DDR3 |
| HDD | 250 GB | 250 GB | 250 GB | 250 GB | 250 GB | Dual 2TB |
| Dedicated IP Ports | 24 | 40 | 0 | 0 | 0 | 0 |
| Dedicated Serial Ports | 8 | 8 | 0 | 0 | 0 | 0 |
| Autosensing Ports | 0 | 0 | 0 | 8 | 32 | 40 |
| RDU Functions | None | None | None | E-Link and RS-485 | All | All |
| MSS Features | Yes | Yes | Yes | Yes | Yes | Yes |
| Power Supply Wattage | 125 W | 125 W | 125 W | 125 W | 125 W | 125 W |
| Power Configuration | Single/Dual | Single/Dual | Single/Dual | Single | Single/Dual | Single/Dual |
| Enclosure | Shallow | Shallow | Shallow | Extended | Extended | Extended | bills of lading, etc. These are not ideal methods, and tend to be ad-hoc in format, inaccurate, and frequently out-of-date. They also do not provide timely access to information about where physical equipment is located and its purpose. The DCIM Inventory Manager module 14 replaces all of these ad-hoc methods with a system that gives a clear picture of the entire inventory of the data center, with equipment counts of IT assets such as servers and switches, and critical infrastructure equipment like power distribution units ("PDUs") and uninterruptible power supplies ("UPSs"). It allows users to quickly see where equipment is located and gives a gross total of power and space usage.

To do this, the DCIM Inventory Manager module 14 may rely on import software capabilities and specialized views, for example: 1) Import capability to extract equipment records from various sources, and combine information from these sources into a complete data set; 2) Geography Views, which allow users to provide the global location of data center installations and drill down to show more detailed location views, such as campus views, regional views, pictures of buildings, etc.; 3) Textual and Graphical Inventory Lists, which are textual views for "placed" and "un-placed" inventory (items which have not been assigned a location); 4) Data Center Portfolio View, which lists the data centers being managed by the system; 5) Floor Plans and Elevation Views for "placed" inventory (items which have been assigned a location); 6) Workspaces, which allow users to combine graphic and data elements from other views to give them a "dashboard" of critical information which they can reference at a moment's notice; and 7) Layers, which allow users to see information from other applications within the Inventory Manager graphic drawings.

The DCIM Inventory Manager module 14 is able to create, update, and delete all represented objects. These objects include:

IT Spaces—areas where IT equipment is located and housed, and at a more granular level, where equipment is installed.

Floors—areas which contain one or many data center spaces, and correlate to a floor in a building.

Data Centers—areas that are designed to house and run IT equipment. Typical data centers have raised floor spaces as well as dedicated power and cooling equipment.

Spaces—regions of a data center floor in which IT equipment is directly installed. Typical data center spaces have raised floors and racks to house equipment, and are secured from unauthorized entry.

Zones—geographic areas of the data center as defined by the customer, which allow the tabulation of capacity and resource usage within areas of the overall data center. In our definition, a zone is one contiguous space within the data center floor.

Other spaces (walkways, free space)—spaces which, when deducted from the total data center space allow for the calculation of usable data center space.

Enterprise—Information about the Enterprise is tracked to give context for the entire data center portfolio and the teams that manage them. Enterprise information may be tracked at the global level in the software.

IT Equipment—may include all equipment used for the direct purpose of data processing, communications, and storage, and the equipment used to house them. This includes: racks, benches, shelves, data closets; servers, network appliances; symbols, placeholders; and sensor equipment.

Critical Infrastructure—may include all devices, which support the cooling and power distribution for the data center space, including: local utility entrance meters, surge protection devices, transformers, switchgears (HV/MV/LV), generators, uninterruptible power supplies (UPSs), energy storage devices & systems (e.g. batteries, flywheels, fuel cells), power disconnects (e.g. circuit breakers, switches/power-ties), static transfer switches, floor mount PDU systems, power panels, remote power panels, busway power distribution, commando sockets, rack PDU, solar arrays, cooling towers, chillers, pumps, economizers (water/air), floor mount CRAC, in-row CRAC, condensers, heat exchangers, and water reservoirs (tanks).

DCIM Configuration Manager Module 30

The DCIM Configuration Manager module 30 expands the management of DCIM records that are provided by the DCIM Inventory Manager module 14. The DCIM Configuration Manager module 30 consumes the capabilities of the DCIM Inventory Manager module 14, extending them to manage relationships between chosen assets. These relationships may include, without limitation, connections, logical groups and redundancies. To do this, the DCIM Configuration Manager module 30 may incorporate various features, such as:

Connection Views, which allow users to details of the connections between any placed assets. This may include topology, end-to-end trace, dependency and redundancy;

Panel Schedules, which allow users to view details of a panel and the breakers within that panel;

Alerting capabilities, which allow a user to specify a threshold for a plan, group or assets and alert on the consumption against that threshold;

Customizable views, which allow a user to customize the views of the application data that they would like to use and navigate; and Web Services Interface, which allows a user to manipulate the application data from an external software entity.

DCIM Facilities Manager Module 16

The DCIM Facilities Manager module 16 provides complete performance utilization and event management capabilities for critical infrastructure equipment. It provides realistic, virtual views of the equipment and racks on the data center floor and surrounding equipment rooms, as well as underlying electrical one-line schematics of the power system and piping and instrumentation diagrams of the cooling system. It may also provide equipment maintenance features to assist in maintenance tracking, scheduling and equipment commissioning. By providing a system view of power and cooling infrastructure as designed, the DCIM Facilities Manager module 16 allows the user to view the power consumption and cooling capacity (both in-use and stranded) of each device, or at the system level. In addition, it lets the user reserve blocks of load on the power and cooling systems, and project the power and cooling capacity needs into the future, based on historic capacity use.

The Facilities Manager module 16 may provide, both textually and graphically, a number of useful views that allow the user to better understand and manage the data center infrastructure. The DCIM Facilities Manager module 16 may display floor plans, electrical diagrams, air distribution, and piping and instrumentation diagrams. The DCIM Facilities Manager module 16 may provide real-time performance status of individual elements or groups of infrastructure equipment. Each item in the diagram allows the user to initiate the following actions or control operations, if supported by the equipment:

Turn on/off the specific piece of equipment/device (if applicable);

Change user configurable items (e.g. set-points, labels); and

View detailed information for each piece of equipment/device.

In addition to primary view diagrams, the DCIM Facilities Manager module 16 may have at least three separate dashboard views to give the user an overall picture of real time operations in the data center infrastructure. An "Industry Efficiency Dashboard" may display the standard efficiency metrics of the data center's energy consumption (e.g. PUE/DCiE). A "Utilities Consumption Dashboard" may display the total power load (kW), total cooling load, water consumption if applicable, and the overall utilities cost. A "Capacity Dashboard" may display a breakdown of the aggregated capacity of the data center equipment per type (e.g. the current capacity of all floor mount PDUs), as well as a breakdown of the stranded capacity of the data center power and cooling systems.

The DCIM Facilities Manager module 16 also provides significant scalability, for example supporting up to 5000 critical infrastructure equipment and instrumentation devices (or possibly more), with an approximate number of 200 data points each, in one example. The equipment data (all parameters other than events) may also be polled at a minimum of every five minutes. Some examples of this data may include temperature, percentage load of a UPS, and circuit breaker state just to name a few example metrics.

Scenario Planner Module 18

The DCIM Scenario Planner module 18 provides the ability to build and compare cost effective scenarios of future resource usage in the data center. It may utilize information from data center infrastructure management applications and real world measurements to map an accurate history of resource usage, and project future trends of growth and decline. With the DCIM Scenario Planner module 18, data center managers and capacity planners can determine the best course of action. Whether it means that installations should be decommissioned and consolidated, or new installations be built, the DCIM Scenario Planner module 18 allows the customer to compare and contrast different scenarios of future data center use. The effect of technology updates, increased density within the data center space, upgrades of the critical infrastructure for more efficient energy use, and gauging demand on IT can be compared to build a plan of action that meets service levels at the lowest possible cost. Once the course of action has been determined, the DCIM Scenario Planner module 18 assists in the communication of the plan to management. Software Capabilities that may be included in DCIM Scenario Planner module 18 include, without limitation, one or more of the following:

The ability to collect and understand past trends of aggregated global data center infrastructure resources;

The ability to project past aggregated usage trends into the future, to predict base infrastructure needs globally;

The ability to conduct "what-if" scenario planning for infrastructure needs, and to assess the impact of data center moves, adds, decommissions and consolidations; and The ability to establish a workflow process for project pipeline management, including refinements by technical experts and system owners, and approvals by business managers.

DCIM Change Planner Module 20

The DCIM Change Planner module 20 allows the users to plan and execute changes in the data center infrastructure. To do this, the DCIM Change Planner module 20 may rely on:

Plan views, allowing users to see details of the planned projects;

Timelines, allowing users to see changes planned for a chosen asset throughout the project; and Alerting capabilities, allowing users to be notified when a task is completed.

The DCIM Change Planner module 20 allows the user to create any number of projects, manage those projects and navigate through them. The user can assign a name, tag, description, target completion date and owner to the project, and can assign individual tasks to the project as well. Once a project has been created its details may be visualized in a calendar format with further details made available for any selected project or tasks. The project can be edited by moving project dates, deleting tasks or adding tasks and the project can be deleted. In addition to specific tasks, the user can assign generic tasks, which do not relate to any particular placed asset in the module. The DCIM Change Planner module 20 also allows the user to assign and view dependencies to other tasks in the project. With the capability to create and manage multiple projects, the possibility arises that there may be conflicts between projects, but the DCIM Change Planner module 20 allows the user to view the conflicts and their severity, and resolve the conflict by changing the parameters of the projects.

Once a project is created and tasks assigned, the DCIM Change Planner module 20 allows the user to view a timeline of the project along with visualizations of the changes associated with any assets affected by the project. The user can see a view of the chosen asset (e.g. a rack), with the assets shown in its various states of change that are scheduled to happen during the lifespan of the project. The DCIM Change Planner module 20 may also display a view of the work to be carried out during a project, colorized by chosen dates, which allows a timeline to show the IT person what is happening on a given date for any chosen assets.

For a given project, the DCIM Change Planner module 20 also allows the user to record all project activity and notify any affected personnel of the activity. A user is notified via email once their designated task or project has been created, edited, has a conflict or is tagged as completed. In addition, the user can create customized reports, import project information in a standard format from an external source, and export project information to PDF or spreadsheet for external use.

DCIM Change Manager Module 22

The DCIM Change Manager module 22 expands the planning and execution capabilities of the DCIM Change Planner module 20 to impose predefined processes or workflows on projects and communicate progress and decisions to project members. To do this, the DCIM Change Manager module 22 may rely on the following software capabilities and specialized views:

Template Workflow Processes that allow a workflow designer to design and publish workflow processes to be used by future projects.

Interaction with DCIM modules, which allows the workflow process to interact with DCIM modules to verify that certain required actions have been completed.

Supports integration with third party IT systems to allow a designer to configure an interface to allow an external source to interrogate the application data and initiate workflow processes.

Human Interaction in a workflow process, which allows a user to interact with a process that was created from a template.

The DCIM Change Manager module 22 provides the ability to create a project template with user defined high level actions supported by lower level tasks provided by the DCIM Change Planner module 20. Project templates may be used to create projects when needed, where the project may follow the template pre-defined steps to completion. A template may contain, without limitation:

Pre-defined high level tasks related to the installed Inventory Manager modules (e.g. "Move server" or "Add connection").

User-defined task categories (e.g. "Move", "Add").

Trigger points to existing workflow templates.

Once a template is created the user can assign roles for use in the template. The user assigns a name, description, and tag to a role, and can assign other users. The DCIM Change Manager module 22 allows for users to be assigned to multiple roles if necessary. In addition to roles, users can create workflow procedures and assign a name, description and tag to each workflow. Once a workflow is created, steps can be added (whether user defined, or predefined) and specific users or roles can be assigned to each step. To add further detail, the user can define rules, such as entry and exit criteria, to each step. Steps may be linked together to define a progression and sub-processes can be created through certain steps.

Once the user has a workflow set up, he/she can simulate a "run" of the execution to identify any errors and validate the workflow. The user may also want to set up customized notifications for various workflow events. The DCIM Change Manager module 22 allows the user to do this, and will propagate notifications to the participants when a task begins, completes, or when any other workflow event occurs.

DCIM Operations Manager Module 24

The DCIM Operations Manager module 24 combines real-world information with managing the data center infrastructure configuration. It provides interfaces to measure performance and utilization across the data center infrastructure and to reveal current available headroom in racks such that the appropriate placement of equipment can be achieved. The DCIM Operations Manager Module 24 may connect to real time data feeds (for power and temperature) from a Manageability Subsystem (MSS) service to compare and validate the performance guidelines and design criteria established in the Configuration Manager module 30 capabilities.

The DCIM Operations Manager module 24 may also be used to optimize power, cooling, and space capacity to bring about overall optimization of data center infrastructure resources. The business problem this module solves is around the management of power and cooling. Large buffers of power and cooling are typically maintained by data center managers to protect systems from outage due to power spikes and periods of increased usage. The amount of buffer to reserve is typically not managed efficiently. Reduction of these buffers allows better utilization of resources. For example, more equipment may be located in one or more equipment racks while sufficient power and cooling needs are still met for all equipment items.

One important feature of this product is that it provides a natural and elegant approach to viewing monitored information about the data center—of which there is a large amount generated by many systems in many different formats. The result of crunching all of this data and seeing it in a usable form makes possible a more accurate understanding of the operation of the data center environment, a better understanding of the true cost of energy use, maximization of the investment in the data center, and ensuring continued 24/7 operations for IT.

The software capabilities are inherited from those defined for the DCIM Configuration Manager module 30 and the DCIM Inventory Manager module 14. The DCIM Operations Manager module 24 adds new features to the DCIM Configuration Manager module 30 capabilities as listed herein. There may be, however, additional software facilities defined for the DCIM Operations Manager module 24 such as, without limitation:

Dashboard for monitoring real-time data feed.

Additional visualizations to show temperature sensor output, and cooling parameters such as airflow.

DCIM Event Monitor Module 26

The DCIM Event Monitor module 26 provides an easy-to-understand system for managing alarms. It provides a single, unified view to monitor alarms for critical infrastructure equipment across the user's entire enterprise. Relevant information is presented in a simple, graphical manner, making it easy to understand and respond quickly. The DCIM Event Monitor module 26 allows the user to, without limitation:

Maintain service level agreements (SLA's).

Keep the business critical IT infrastructure available and online.

Maintain critical infrastructure system redundancy.

Acknowledge and verify that actions have taken place.

DCIM Virtualization Manager Module 28

The DCIM Virtualization Manager module 28 provides tools to manage virtual infrastructure in a data center. It helps to map physical machines with virtual machines, manage the virtual machines and group the virtual machines for ease of management. The DCIM Virtualization Manager module 28 may relay the information to the DCIM Operations Manager module 24 for interfacing with virtualization management servers (e.g. VMware Virtual Center Management Server). The DCIM Operations Manager module 24 may then auto-discover host machines and virtual machines, relaying this information back to the DCIM Virtualization Manager module 28. With this information the user is able to specify the synchronization schedule of virtualization infrastructure information between virtualization management and virtualization management servers on periodic, pre-defined time intervals. The user may also initiate synchronization on a demand basis from the DCIM Virtualization Manager module 28.

With the virtualization inventory synchronized, the user is able to view the inventory in a graphical format. The DCIM Virtualization Manager module 28 may depict the virtual machines graphically against the physical inventory or servers to show which virtual machines are housed where. In addition, the DCIM Virtualization Manager module 28 may provide a cluster view (showing the groups of virtual machines in various clusters), a virtual list of servers with associated virtual machines, and a search feature allowing the user to find the specific virtual machine, cluster or server that he/she wants to manage. When the user selects the correct virtual machine, the Virtualization Manager module 28 provides the ability to access the virtual machine console by launching the virtualization provider's Remote Console, a Web browser or a RDP from a virtual machine.

Additional Details of DCIM Solution 10

Figure 5:
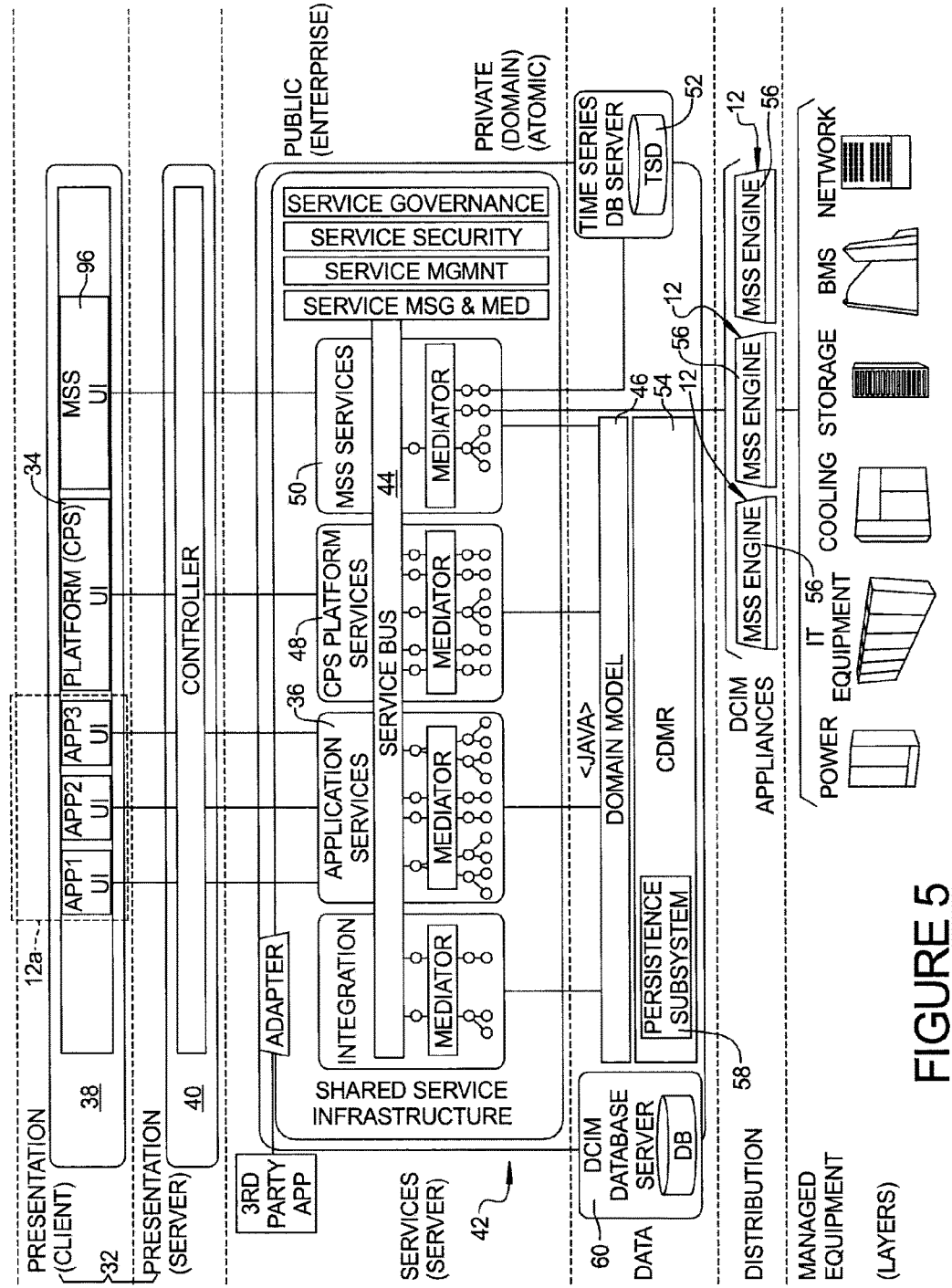
FIG. 5 is a high level diagram of one example of the DCIM Solution architecture.

Referring to FIG. 5, various components of the DCIM Solution 10 can be seen. The architecture of the DCIM Solution 10 contains the following high level components. Each component will be described in more detail in the discussion below.

Presentation UI 32—

These components represent the human interface for individual applications and for the platform. A Common Platform 34 contains a web-based Console Framework that allows individual applications and the platform to plug-in user interface components. The Presentation UI 32 consumes public interfaces exposed by a Services layer 36 that provide the actual business functionality. Logically, the Presentation UI 32 may be broken into two layers: a client layer 38, typically resident within a web browser and representing the "View" in a Model-View-Controller architecture, and a server layer 40, typically representing the Controller.

Enterprise Service Bus (ESB)—

An ENP Common Platform 42 contains an Enterprise Service Bus 44 that provides a container for Business Services and provides for intelligent routing of messages between services. The architecture presumes that communications between the Presentation UI 32 layer (specifically, the controller 40) and the ESB 44 will be SOAP/HTTP, although other transports may be used based on specific application design requirements.

Application Services 36—

These may be individual and/or composite services that provide product application functionality. A service composition is an aggregate of services collectively composed to automate a particular task or business process. These services 36 can be made up of both private and public services. Public services are exposed on the ESB 44 and available for other applications to consume. These application services 36 use a Domain Model 46 (for example via Java) to access business objects specific to the product domain.

Common Platform Services 48—

These are utility services provided as part of the ENP Common Platform 42 and may be either individual or composite services. The ENP Common Platform 42 provides these services which are likely to be used by any product and may include services such as authentication, authorization and auditing. These services are configurable such that a Product Line Architecture PLA may select which services to include for a given PLA. For maximum extensibility, these services should be data driven such that they are also extensible by adding domain specific knowledge (e.g. a new event type unique to a given domain).

Manageability Subsystem (MSS) Services 50—

These are composite services that provide for management (e.g. Discovery, Data Acquisition, Command & Control) of managed elements (or managed devices) via a distributed real-time framework. The MSS Services 50 interacts with the DCIM appliances 12 to perform data acquisition and store acquired data in a Time Series Database 52 and a Common Data Model Repository CDMR 54.

Time Series Database (TSD) 52—

The time-series database 52 operates to persist telemetry data sent from the MMS Services 50.

DCIM Appliance 12—

The DCIM appliance 12 (or appliances 12) form a hardware appliance that is the touch point to the managed equipment or managed devices. Each DCIM appliance 12 can be loaded with several software applications including KVM, Serial, Service Processor and an MSS Engine 56 for data acquisition.

MSS Engine 56—

The MSS Engine 56 may be a software component that can be deployed on each DCIM appliance 12 to acquire metric data and perform management (e.g. Discovery, Data Acquisition, Command & Control) on managed equipment being handled by each DCIM appliance 12. The MSS Engine 56 feeds data to the MSS Services 50 for storage in the Time Series Database 52 and the CDMR 54.

Managed Equipment (or Managed Devices or Managed Components)—

Represents an entity (e.g. a "device") that is addressable and can be managed (i.e., controlled in some way) and/or monitored.

Domain Model 46—

The Domain Model 46 provides a common definition of domain concepts across all applications (e.g. a shared, extensible library of domain classes that allow for application specific customization). In one example, the Domain Model 46 may be represented as native Java objects. It also delegates manageability knobs and dials type operations to the MSS Services 50.

Common Data Model Repository (CDMR) 54—

The CDMR 54 forms a repository that is responsible for creating and persisting the Domain Model objects. The CDMR 54 hides the complexity of initializing domain objects and hides a persistence subsystem 58.

DCIM Datastore 60—

A DCIM Datastore 60 may be a SQL database that persists the defined domain objects and other configuration information associated with these domain objects. The DCIM Datastore 60 may be in communication with the persistence subsystem 58.

Integration Services 62—

Composite services that are deployed to support integration with $3^{rd}$ Party Applications.

$3^{rd}$ Party Applications—

External applications that can be integrated with the ENP Common Platform 42 (e.g., Hewlett-Packard OpenView software, CiscoWorks LAN management solution tools, the EMC Corporation EMC Smarts Application Discovery Manager (ADM)).

Technology Alliances—development of key technology alliances (internal to Emerson and external) to tightly integrate and enable a closed loop control system. Technical alliances with:

Emerson Network Power Products: Liebert Power and Cooling products to embed DCIM components to within managed devices and elements allow discovery, monitoring and control of various Liebert products.

External technology alliances (for example: Cisco, EMC and Vmware to embed DCIM components in managed devices and elements to provide detailed information on server workloads and integrate Power & Cooling consumption.

All components can be deployed on the same server, but the DCIM Solution 10 is flexible enough to allow major components to be placed on separate servers (e.g. Client, Application Server, Database Server, Report Server, etc.) for scalability and redundancy purposes.

The following is a further discussion of various components of the DCIM Solution 10.

Domain Model/CDMR

Figure 6:
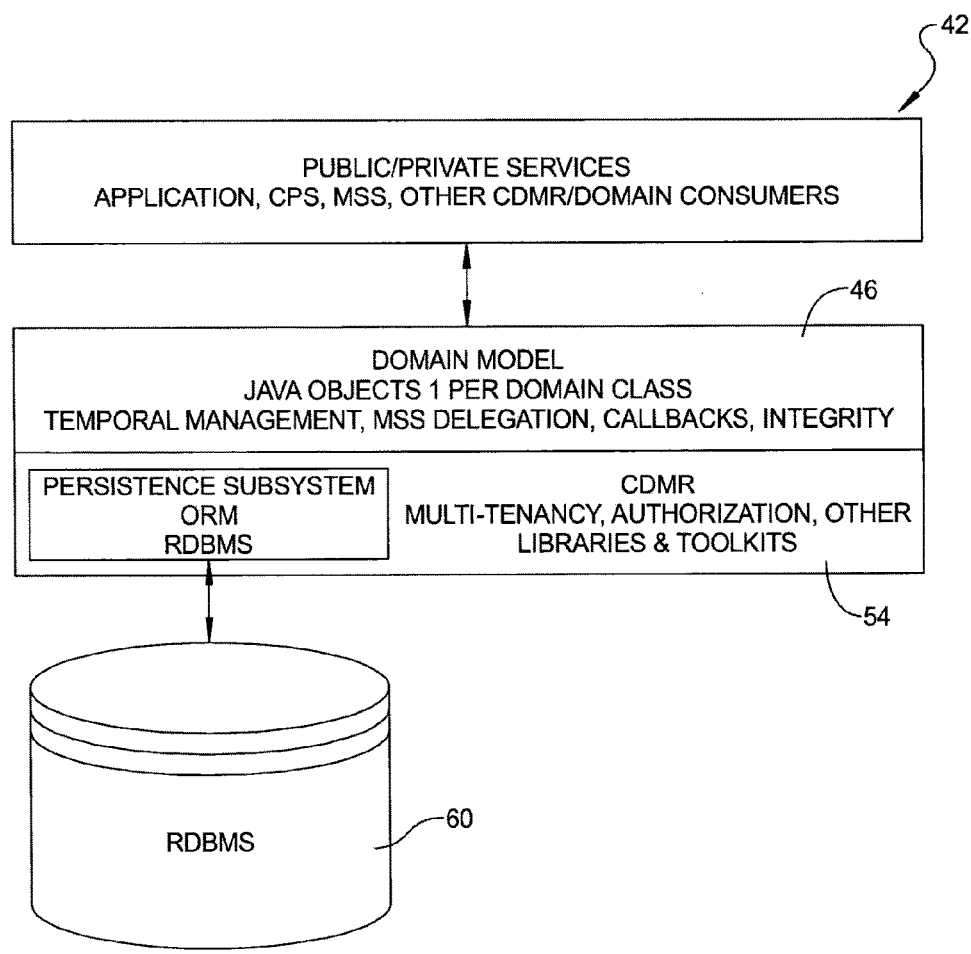
FIG. 6 is a high level diagram of showing the relationship between the Public/Private services and the DCIM Solution's Domain model and CDMR.

Referring to FIG. 6, the Domain Model 46 may be viewed as a collection of Java classes that represent data center infrastructure entities—and the context in which those entities exist. In addition, the Domain Model 46 may represent users, software licenses and other associated data center infrastructure management (DCIM) entities. These can be viewed as the "facts". These facts are used by applications and services.

A common data model may be shared across all of the DCIM application modules 14-30. Individual products often extend the DCIM product line's shared, common data model. The CDMR 54 maps Java class instances to persistent storage (in a relational database, such as the DCIM datastore 60), enforces authorization, segregates tenants, checks integrity constraints, etc. A variety of cross-cutting concerns can be addressed by the CDMR.

The Domain Model 46 is the collection of domain classes used to represent entities (under management), relationships amongst entities, and policies about entities and so on. The Domain Model 46 establishes the conventions for representing all of the known 'facts' within the DCIM domain. Then, these 'facts' are shared across all products within the DCIM product line.

Figure 7:
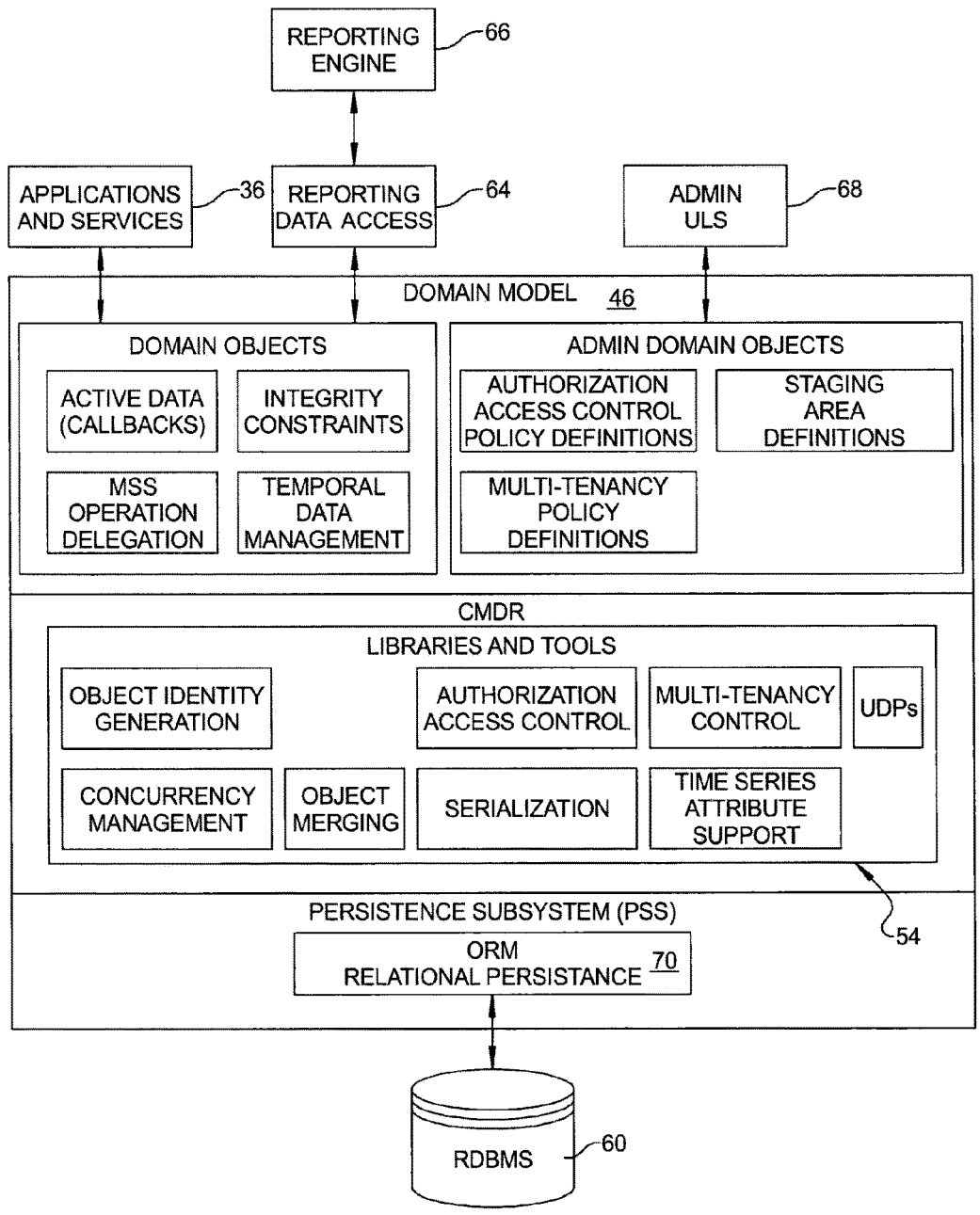
FIG. 7 is a high level block diagram showing the distinction between the domain objects that are used across domain models and DCIM domain objects.

Referring to FIG. 7, the CDMR 54 presents supervision control and data acquisition (SCADA) solution for the entities under management. This interface is tightly coupled to domain objects. The CDMR 54 supports an arbitrary set of domain classes (which constitutes the Domain Model). The CDMR 54 coordinates concurrent object modifications, supports domain object persistence and provides a number of other support services (like object identifier—OID generation conventions/mechanisms). In addition, the CDMR 54 offers a suite of facilities that can be called upon by domain class developers to address cross cutting concerns like authorization resolution/enforcement, multi-tenancy checks, volatile attribute access, etc.

Figure 8:
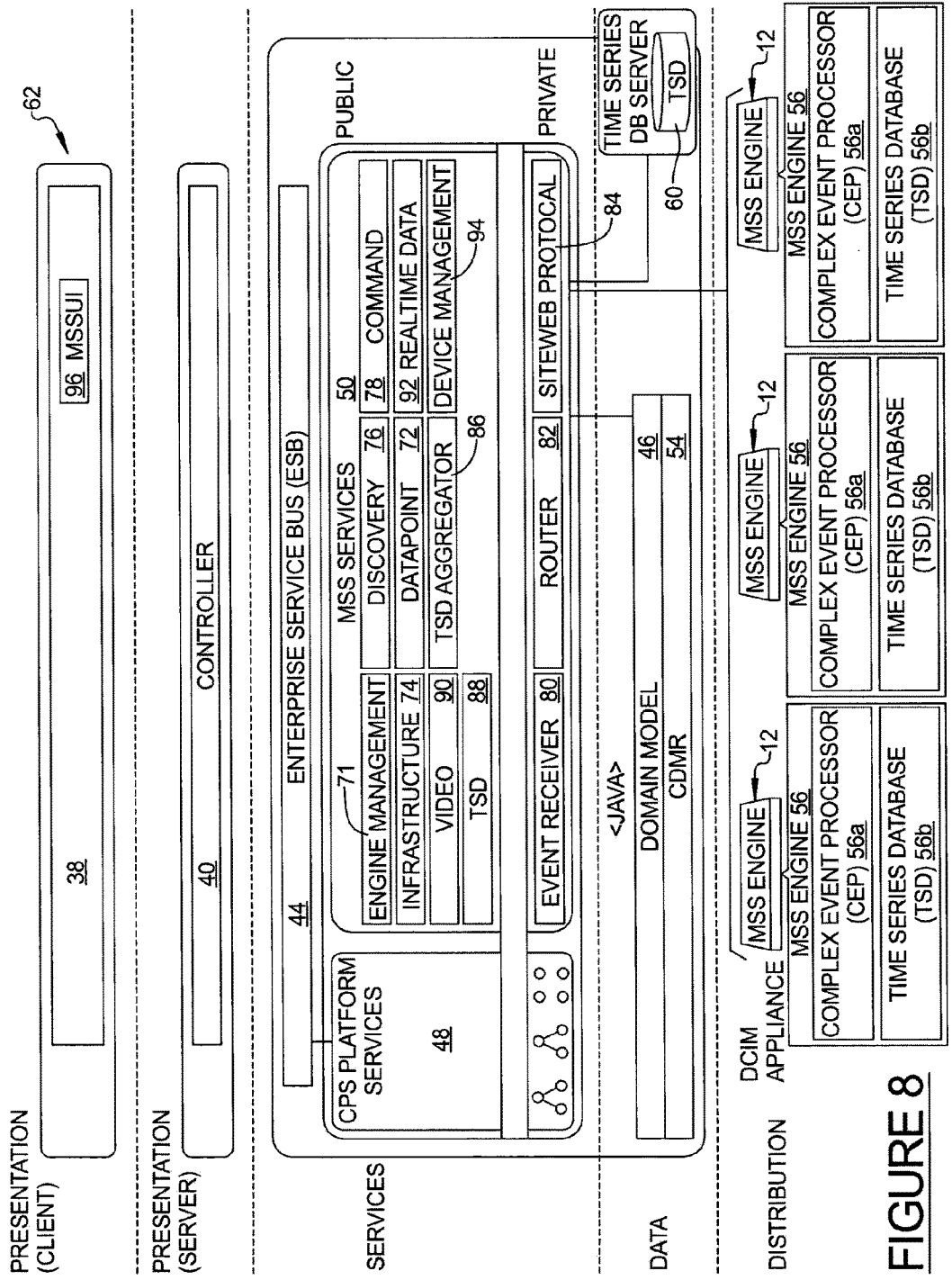
FIG. 8 is a high level block diagram of one example of an architecture showing an interaction of MSS components with the Domain Model and the MSS Engine/DCIM Appliance.

For most purposes the DCIM Domain Model 46 hides a Manageability Subsystem (MSS) 62 that is formed by the MSS Services 50 and the MSS engines 56 (to be discussed further in connection with FIG. 8). Command and control operations are initiated through the Domain Model 46 and are delegated to the MSS subsystem 62 as needed.

Under the covers of the DCIM Domain Model 46, the MSS Engines 56 may reuse the CDMR-supported DCIM Domain Model 46. This obviates the need to design a distinct representation of domain model information—and the need to then map that into (and out of) the CDMR 54 supported DCIM Domain Model 46. This also allows the MSS Engines 56 to reuse the CDMR 54 for final (closest to the device and most recent) checking of authorization policies, multi-tenancy policies, integrity constraints and so on. To support multiple network operation centers, each and every CDMR 54 instance may participate in an eager (ASAP) eventual consistency regime.

The above discussion explains a distinction between the domain objects that are used across domain models and DCIM domain objects. Above, the domain objects that apply across domain models are called 'admin domain objects'. Essentially, these are the domain objects that describe some aspect of other domain objects—e.g. authorization policies (about domain objects), multi-tenancy policies (about domain objects), user defined properties (UDPs—associated with domain objects), etc.

In a literal sense, the depicted 'admin domain objects' are the domain model objects contributed by the 'platform' itself. More specifically, the examples shows are contributed by (and potentially required by) the CDMR 54 component of the platform.

The depicted libraries and tools may comprise the CDMR 54. The first of these may be a reusable (JAVA) library for generating global unique identifiers (GUIDS) to serve as object identifiers. Other libraries may help with resolving/enforcing access controls (e.g. authorization), multi-tenancy controls, user defined property management, serialization (e.g. generic, reflection driven, formatting), etc. In this sense, the dividing line between the Domain Model's 46 class implementations, and the CDMR 54, is somewhat blurred. It may be thought of as something of a dashed line. However, all application/service logic should be strongly insulated from whatever happens under the covers of the domain class interfaces. This effectively raises the level of abstraction at which application/service logic is implemented.

Interaction Requirements

The Domain Model 46, and it's supporting CDMR 54, provides storage agnostic data sharing across the DCIM product line. In addition, the Domain-Model/CDMR duo addresses cross cutting concerns related to data access, delegation of appropriate tasks to the Manageability subsystem (MSS) 62, data change triggers/callbacks, etc. Domain Model 46 consumers are application services, common platform services and even the Manageability Subsystem 62. The MSS Services 50 relays discovery information as new instances of Domain Model 46 classes (stored in the CDMR 54). The Domain Model 46 may represent a single source of truth—and a single source of history.

Applications and Services 36—CRUD Domain Objects as required to support application features.

Reporting Data Access 64—Read only access to the Domain Objects for reporting purposes. This requires a "data provider" for a chosen reporting engine 66.

Admin UIs 68—CRUD Admin Domain Objects defining access policies, multi-tenancy policies, integrity constraint policies and other policies. These policies configure and drive the handling of crosscutting concerns.

Manageability Subsystem 62 delegation—Certain operations (e.g. commands, controls, etc.) associated with domain objects should be delegated to the Manageability Subsystem 62 for ultimate execution. Current, volatile data access (for sensor readings, etc.) should also be delegated to the Manageability Subsystem 62 for real-time fetching (versus latest value/estimate lookup).

ORM/RDBMS 60 access—Domain objects are persisted to the RDBMS 60 via an Object Relational Mapping technology (layer 70). Direct access to the underlying RDBMS is a circumvention of the Domain Model 46 (and supporting CDMR 54) layers. For application/service level logic, direct access to the underlying RDBMS 60 would be a serious architectural violation.

On the other hand, the Domain Model 46 and the CDMR 54 are deliberately extensible, should specific bits of domain class related logic be best implemented via hand-crafted SQL, stored procedures, etc. When faced with some of the relatively rare, but most challenging, implementation needs, it may be necessary to sprinkle the implementation logic at the application level, the domain model level and even the CDMR/ORM/RDBMS levels.

Reuse

The DCIM Solution's 10 product line's common data model leverages domain knowledge manifest in the representational models used in Aperture® Vista, the Avocent® MergePoint™ Infrastructure Explorer (AMIE), the information technology operations management (ITOM) library prototype, DSView, etc. The common data model may also leverage certain aspects of industry standards like the Distributed Management Task Force's (DMTF's) Common Information Model (CIM).

The CDMR 54 may be based on an industry-standard (SQL99) relational database management system (RDBMS).

Some of the most important domain classes, within the Domain Model 46, delegate manageability operations to the Manageability Subsystem 62. In addition, the Manageability Subsystem 62 feeds discovery/presence information, about domain class instances, into the Domain Model 46. Certain policies, for things like correlated event filtering, are also delegated to the Manageability Subsystem 62 for distributed processing (close to the sources of such events).

Manageability Subsystem

The Manageability Subsystem, represented by reference number 62, is shown in greater detail in FIG. 8. The Manageability Subsystem 62 provides the ability to discover and control Emerson and non-Emerson devices, and collect and analyze real time data from those devices. The Manageability Subsystem 62 may be made up of three major areas:

MSS Services 50—exposes public services on the platform 42 to provide applications and the Domain Model 46 with access to Manageability Subsystem 62 features such as the retrieval of historical data points that have been collected over time and the retrieval of data points on demand directly from the end devices. The Manageability Subsystem 62 provides private services used for communication between the platform 42 and the MSS Engines 56.

TSD 52 (Time Series Database)—stores the historical data points that have been collected over time. Applications and the Domain Model 46 can retrieve these data points through the public interfaces exposed on the platform 42.

Manageability Subsystem 62

MSS Engine 56—may be software that runs in the DCIM appliance 12 providing discovery and control of Emerson® and non-Emerson devices, and collection and analysis of the real time data from those devices. The MSS Engine 56 may contain the knowledge for how to communicate with Emerson® and non-Emerson devices. The MSS Engine 56 communicates with the MSS Services 50 running on the platform 42. Multiple MSS Engines 56 can be deployed in the customer environment to provide scalability as the number of managed devices to be supported grows. Each MSS Engine 56 may use a Complex Event Processor (CEP) 56a to ensure real time data aggregation and correlation. A Time Series Database 56b may be associated with each MSS Engine 56 for storing collected real time data. The following section briefly describes Manageability Subsystem 62 components with the Domain Model 46 and the MSS Engine 56/DCIM appliance 12.

Engine Management—An Engine Management service 71 provides the ability to manage Domain Model objects that represent the MSS Engines 56 and related objects, such as product knowledge and plug-ins. This service also provides the ability to add, update and manage MSS Engines 56 that are of the DCIM Solution 10.

Datapoint—A Datapoint service 72 provides the ability to access collected metric data and to configure the rules related to data point collection, aggregation, and analysis.

Infrastructure—An Infrastructure service 74 provides the ability to manage the infrastructure (devices, containers, relationships, collection rules, aggregation rules, and analysis rules) of the MSS Engine 56. The infrastructure service 74 keeps the infrastructure objects synchronized between the Domain Model 46 (and supporting CDMR 54) and the MSS Engines 56. As changes and additions are made to Domain Model objects on the platform 42 the necessary information is synchronized with the MSS Engines 56. The infrastructure service 74 service also handles synchronizing new and updated devices/relationships that are discovered by the MSS Engines 56 with the Domain Model 46 of the platform 42.

Discovery—A Discovery service 76 provides the ability to manage the discovery parameters and also provides means to perform on-demand discovery. The MSS Engines 56 actually perform the on-demand discovery and background discovery activities based on these configured discovery parameters.

Command—A Command service 78 provides the ability to execute commands on devices, such as PowerOff and PowerOn. The MSS Engines 56 actually handle sending the necessary commands to devices or appliances to cause the desired action on a device.

Event Receiver—An Event Receiver 80 service processes unsolicited events received from one or more MSS Engines 56. These events are converted as needed to match the Domain Model 46 definitions of the platform 42 and these events are then forwarded to the Events system of the platform 42.

Router—A Router component 82 handles the routing of requests between the MSS Services 50 and the MSS Engines 56. For requests from the MSS Services 50 this component determines the appropriate MSS Engine 56 to handle the request, such as an on-demand discovery request or a Power Off request. For request from the MSS Engines 56 this component determines the appropriate MSS Service to handle the request.

SiteWeb Protocol—A SiteWeb Protocol component 84 implements proprietary SiteWeb protocol and provides communication between MSS components and MSS Engine 56/DCIM appliance 12.

TSD Aggregator—A TSD Aggregator services 86 communicates with the TSD 60 to perform aggregation of infrastructure container(s) that span devices managed by more than one MSS Engine 56. The aggregation rules define how the data is aggregated and the results are stored in the TSD 60.

Video—A Video service 90 provides the ability to retrieve video content stored or captured in the MSS engines 56. Video data can be streamed from the MSS Engines 56 to consumers.

Realtime Data—A Realtime Data service 92 provides the ability to retrieve metric values in realtime in a streaming/ongoing manner from the MSS Engines 56. The real-time data can be streamed from the MSS Engines 56 to consumers.

TSD—A TSD service 88 provides the ability to manage Domain Model objects that represent the TSD 60 and the ability to configure the TSD 60.

Device Management—A Device Management service 94 provides the ability to perform upgrades, configure and manage devices.

Interaction Requirements

The MSS Services 50 manipulate domain objects via Java interfaces exposed by the Domain Model 46 for data persistence and access. This enables the following:

Provides basic create, update, delete, and querying of domain objects;

Allows for synchronization of new or updated domain objects identified by discovery of the MSS Engine 56;

Allows for synchronization of domain objects between the Platform 42 and the MSS Engines 56; and Allows access to rules to control data aggregation and data analysis.

Delegate methods of the domain objects in the Domain Model 46 may consume public MSS Services 50 using SOAP via the Enterprise Service Bus (ESB) 44. These delegate methods may be used to perform the following activities:

Execution of commands, such as PowerOff;
  Retrieve historical metric values;
  Retrieve on-demand metric values; and
  Perform on-demand discovery operations.

The public and private MSS Services 50 use the Router component 82 to route requests to the appropriate MSS Engine 56.

The MSS Services 50 consume CPS Platform Services of the platform 42 using SOAP via the ESB 44. The CPS Platform Services may be consumed for the following reasons.

Consume Authorization Service to determine that necessary rights for enforcement of functionality provided by the MSS Services 50;
  Consume Licensing Services to determine what functionality is available by the MSS Services;
  Consuming Eventing Service for the publishing of events; and
  Consuming Eventing Services for the registration of notifications based on events.

The MSS Services 50 may use a suitable communications component to communicate with the MSS Engine 56.

The MSS Services 50 interacts with the MSS Engines 56 on the DCIM appliance 12 using a suitable communication component to achieve the following functionality.

Command Execution;
  Discovery;
  Data Collection;
  Firmware Upgrades; and
  Configuration.

An MSS UI 96 interacts with the Presentation server 40 (i.e., its controller) over HTTP and the controller interacts with the MSS Services 50 using SOAP or another suitable protocol (e.g., via the ESB 44).

The Application Services 36 (FIG. 5) consume video and real time data streaming via a publication/subscription mechanism from the MSS Services 50. The video and real time data streaming is retrieved from the MSS Engines 56.

DCIM Appliance

Figure 9:
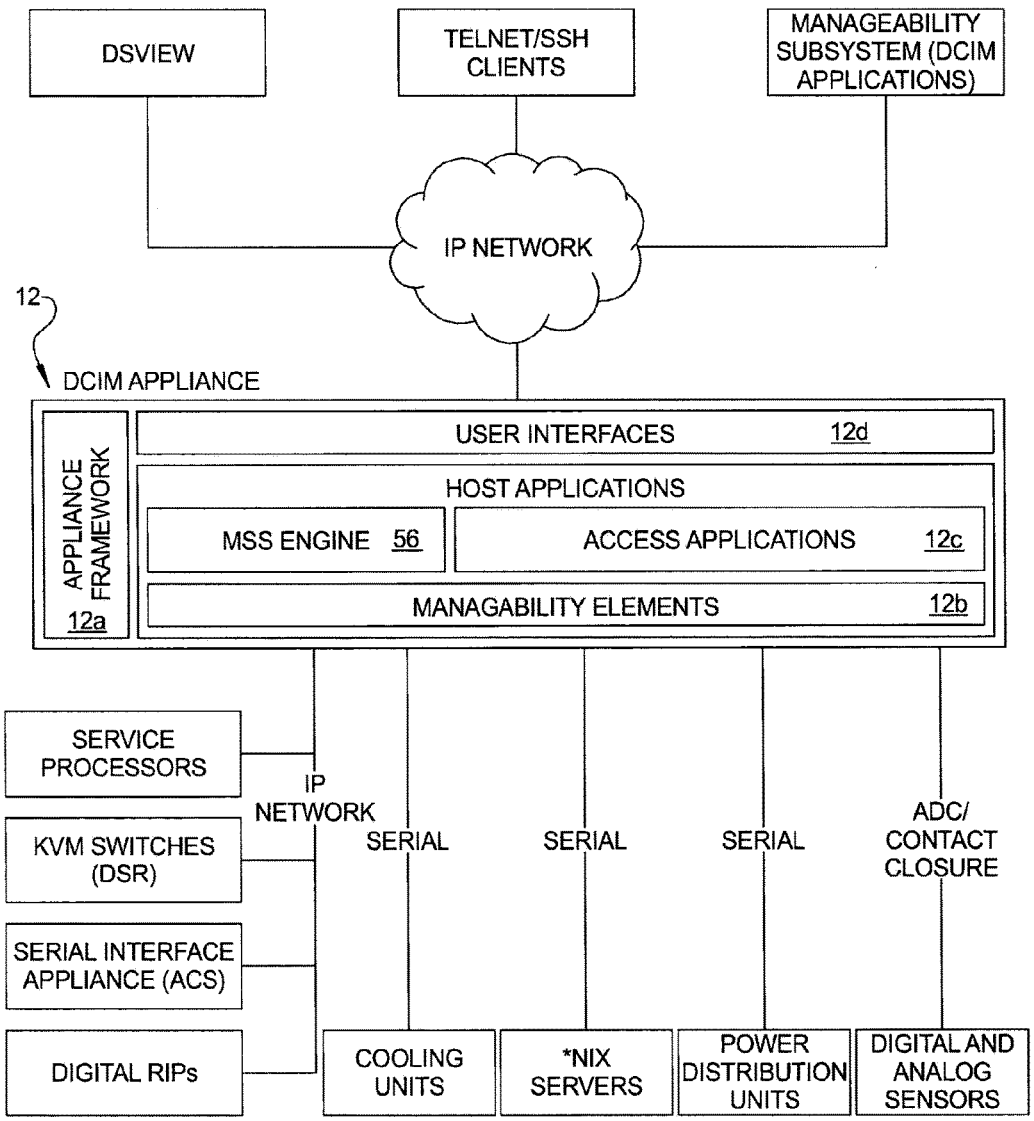
FIG. 9 is a high level diagram of one example of implementing the DCIM solution.
Figure 10:
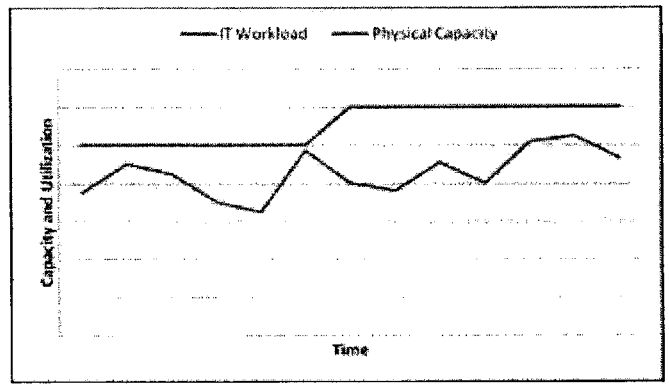
FIG. 10 is a graph illustrating how an IT workload may vary with time, and further illustrating how IT workloads are given a physical capacity "safety margin" within which they operate.
Figure 11:
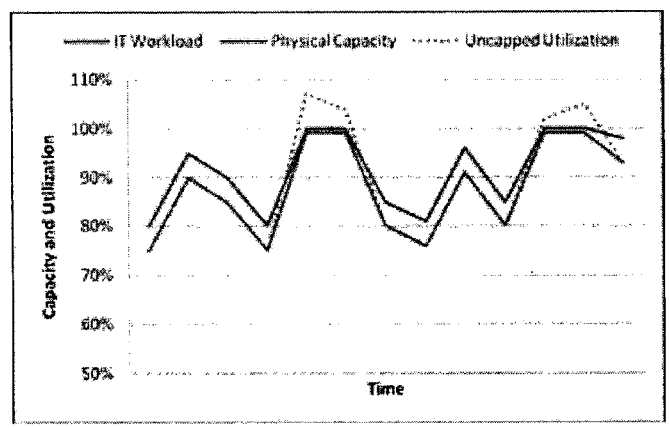
FIG. 11 is a graph illustrating how, in an ideal environment, the physical capacity (cooling and power) would be adjusted throughout the day to meet match the IT needs, and also how the amount of resources available to IT infrastructure would be capped in the event the amount of IT resources used by IT equipment attempts to exceed the overall physical capacity available to the data center.

The DCIM appliance 12 is shown in one embodiment in FIG. 9. The DCIM appliance 12 provides the MSS Engine 56 capabilities and therefore provides the gateway between the DCIM Solution 10 application layers and the actual infrastructure devices which are being managed. It also provides a collection of industry standard interfaces such as a WebGUI, an SSH/Telnet based CLI, and SMASH/CLP which allow it to provide device management in a stand-alone environment. The external interfaces are purposely limited to provide a subset of the overall functionality available to the DCIM application suite. There are also Avocent specific protocols that may be used for access purposes which are currently consumed by DSView and may eventually be used for DCIM based access applications.

Architecture of DCIM Appliance

The detailed architecture of the DCIM appliance 12 may be thought of (at a high level) as being a system that is divided into three major areas including 1) Appliance Framework 12a; 2) Manageability Elements 12b/Access Applications 12c, and 3) User Interfaces 12d.

The Appliance Framework 12a provides a set of common services such as database management, authentication, and others which can be used by all of the components in the DCIM Solution 10. Another key part of the framework is a set of standardized communication interfaces that components can use to move data and messages around the DCIM Solution 10.

The "Manageability Elements 12b" can consist of components that know how to speak to the individual managed devices and equipment. Some examples of managed devices and equipment include:

KVM Switches;
  Serial Interface appliances;
  Power Distribution Units (PDUs);
  Digital Rack Interface Pods;
  Service Processors;
  Cooling units;
  Digital and Analog Sensors; and
  $3^{rd}$ Party devices.

This area also includes the Application components which perform various tasks but do not have any external interfaces. The MSS Engine 56 components such as the CEP 56a and the Time Series Database 56b, as well as some extended features inherited from the access appliance, are all examples of applications.

The User Interface 12d may contain the user interfaces such as the Onboard WebUI, command line interfaces, and importantly a MSS Manageability Protocol for communicating with the MSS engines 56. The communication interfaces provided by the Appliance framework 12a allow a common method for the UI components to get data and send control messages to the various applications and manageability extensions.

The above described architecture enables the DCIM appliance 12 to be easily deployed in a variety of configurations with support for different numbers and types of managed elements being supported in each configuration. This design based on pluggable components, also allows for easily adding new classes of managed devices as the product line progresses.

Cloud Implementation of DCIM Solution 10

Referring to FIG. 9, one example of a "cloud" implementation of the DCIM Solution 10 is shown. In this example the Cloud 13 may be understood as any wide area network, but in one specific form it may comprise the World Wide Web (or simply the "Web"). For convenience the Cloud 13 will be referred to throughout as the "Web" 13.

The DCIM software suite of applications of the presentation UI 32 may be located at a first location, the Customers A and B may each be located at other remote locations, and the CPS 42 may be located at still another remote location. The DCIM appliances 12 may also be located at remote locations and each may be in communication with the CPS 42 and the presentation UI 32 via the Web 13. The Customers A and B may each be in communication with the presentation UI 32 via the Web 13, and the presentation UI 32 may in communication with the CPS 42 via the Web 13. Finally the appliances 12 may each be in communication with the CPS 42 via the Web 13. As will be appreciated, the cloud configuration shown in FIG. 9 enables each of the presentation UI 32 and the CPS 42 to be provided as a "service" over the Web 13. This enables one CPS 42 to be used to communicate with a plurality of DCIM appliances 12 located at different locations. Similarly, the presentation UI 32 could potentially be used "as a service" to communicate with a plurality of CPSs 42 located at different sites. This provides tremendous flexibility in scaling the DCIM solution 10 to meet the needs of rapidly expanding data centers, and especially where managed equipment or devices are located in physically remote locations, possibly in different states or even in different countries. It will be appreciated that the diagram of FIG. 9 is only one possible configuration for deploying the DCIM solution 10 in a "cloud" environment, and many other possible configurations will be apparent to those skilled in this art.

DCIM System Incorporating Infrastructure Control Fabric System

Referring now to FIGS. 12-19, an implementation of a DCIM system 1000 involving an Infrastructure Control Fabric system 1010 (hereinafter the "ICF 1010") will be described in connection with a computing system, which in this example is a Unified Computing System (hereinafter "UCS") produced by Cisco Systems, Inc. of San Jose, Calif. The DCIM system 1000 may otherwise be constructed similar to the DCIM 10, and may have some or all of the features described above for DCIM 10. The UCS will be described as operating within a data center environment. It will be appreciated immediately that while the following discussion will focus on the UCS produced by Cisco Systems, Inc., that the principles and features of the ICF 1010 are equally applicable and valid for other managed devices often used in a data center. Also, the teachings presented herein relative to the ICF 1010 could just as readily be applied to specific systems or devices of other manufacturers. For example, the ICF 1010 could be easily adapted for use with components or systems manufactured by EMC Corp. of Hopkinton, Mass. (for storage devices), VMware, Inc. of Palo Alto, Calif. (for virtualization) and other server or data center component vendors. So while the examples are based on the ICF 1010 being used with a Cisco component, it will be understood that this is simply one example implementation of the ICF 1010, and that the ICF 1010 is expected to find utility in connection with a wide variety of managed devices from a wide variety of manufacturers.

In brief, the DCIM 1000 includes the Infrastructure Control Fabric 1010 which provides an architecture design and associated software that allows a wide range of data center devices such as blade servers, rack servers, storage management equipment, virtualization centers and others to communicate directly with the various data center infrastructure management tools. This enables each of the devices to be provided with real-time knowledge of the devices' power consumption, cooling availability, temperature and/or humidity, specific location within the data center, and the relationship of the device with the datacenter ecosystem. Thus, rather than presenting itself simply as another management tool available for a given data center device to access, the ICF 1010 works in a side-by-side fashion with each enrolled device without disrupting the existent device's user interface or the interaction between the given device and other management tools that the given device communicates with. In effect, the real time information and communication by the given device appears essentially transparent to the device's user interface and to other components that may be in communication with the device.

An additional advantage is that the user interface of each device that is enrolled to communicate with the ICF 1010 may require only minimal modifications in order to cover the device's enrollment process. However, it is expected that in most instances the user interface of each enrolled device will not require any changes in the way a user controls the device. By sharing important real time power information, cooling information and other operational information with each data center device, in real time, each device's decision making capability can be significantly enhanced. In specific instances the real time information that a specific data center device receives from the ICF 1010 can enable the device to avoid turning on a subcomponent thereof (e.g., another server in a specific equipment chassis) if turning on the subcomponent may violate previously determined power and/or cooling capacity rules assigned to the specific equipment chassis. In other instances a component may request a device (e.g., blade server, rack server, storage management device, a virtualization center, etc.) mounted within a given chassis to power on, without the knowledge that such action may violate predetermined power and/or cooling capacity allocation rules for the given chassis in which the device is mounted. Because the ICF 1010 communicates directly and seamlessly with the computing device, the computing device is able to make a real time inquiry to the ICF 1010 as to whether powering on the requested blade server can be done without violating the predetermined power and/or cooling allocation rules. The ICF 1010 is then able to make this determination and to inform the computing device, in real time, whether powering on the blade server is permissible, in view of the predetermined power and cooling capacity allocation rues. Advantageously, these bidirectional communications may be transparent to a user monitoring operation of the computing device.

Figure 12:
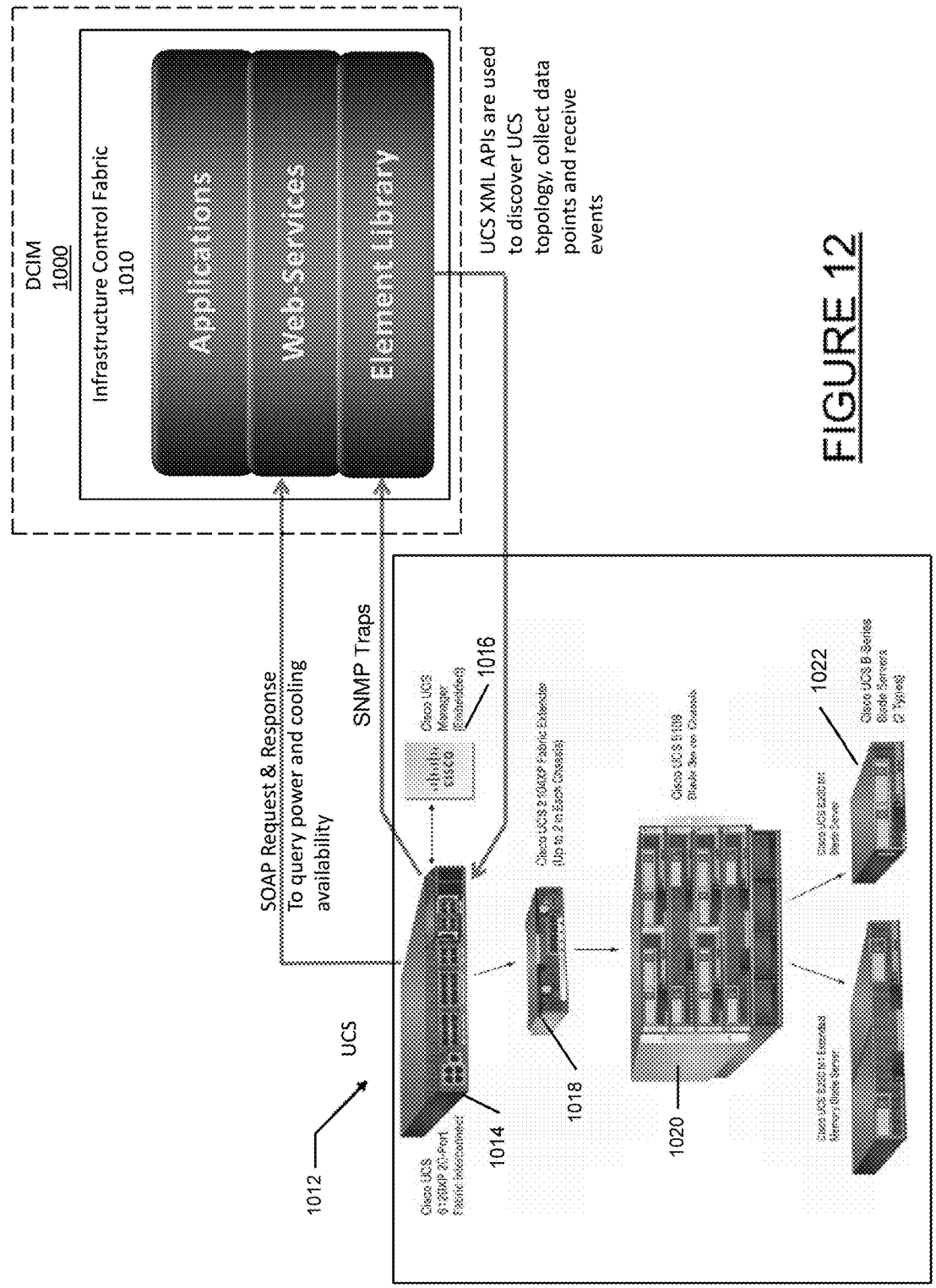
FIG. 12 is a high level block diagram of an embodiment of a DCIM system in accordance with the present disclosure being used to directly communicate with a Cisco Unified Computing System (UCS)

A key innovative feature of the ICF 1010 is that it enables the managed device to "reach out" to the ICF 1010 for validation on operations that involve power, cooling and space (besides additional functionality). The use of the ICF 1010 thus effectively closes the gap between the managed device and other data center components by providing a direct path between the managed device and the ICF 1010 (as shown in FIG. 12 as SOAP request & response, or alternatively through REST request and response or even possibly other ways of communication). This enables the managed device to obtain real time information (e.g., on power, cooling or space restrictions/availability) before taking some specific action.

Figure 17:
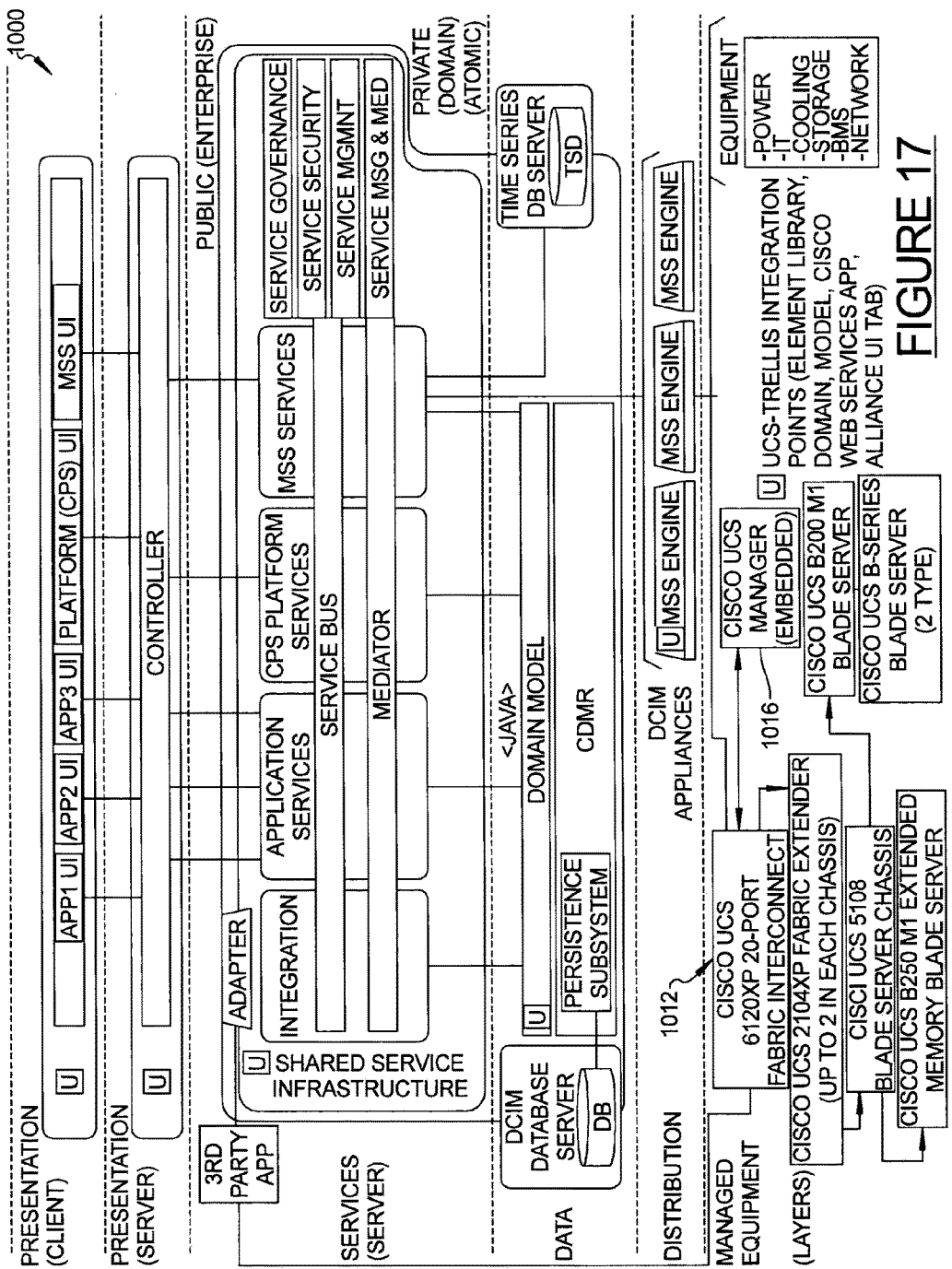
FIG. 17 is a high level diagram illustrating the points where the UCS is integrated into various subsystems or components of the DCIM, pursuant to forming the ICF.
Figure 18:
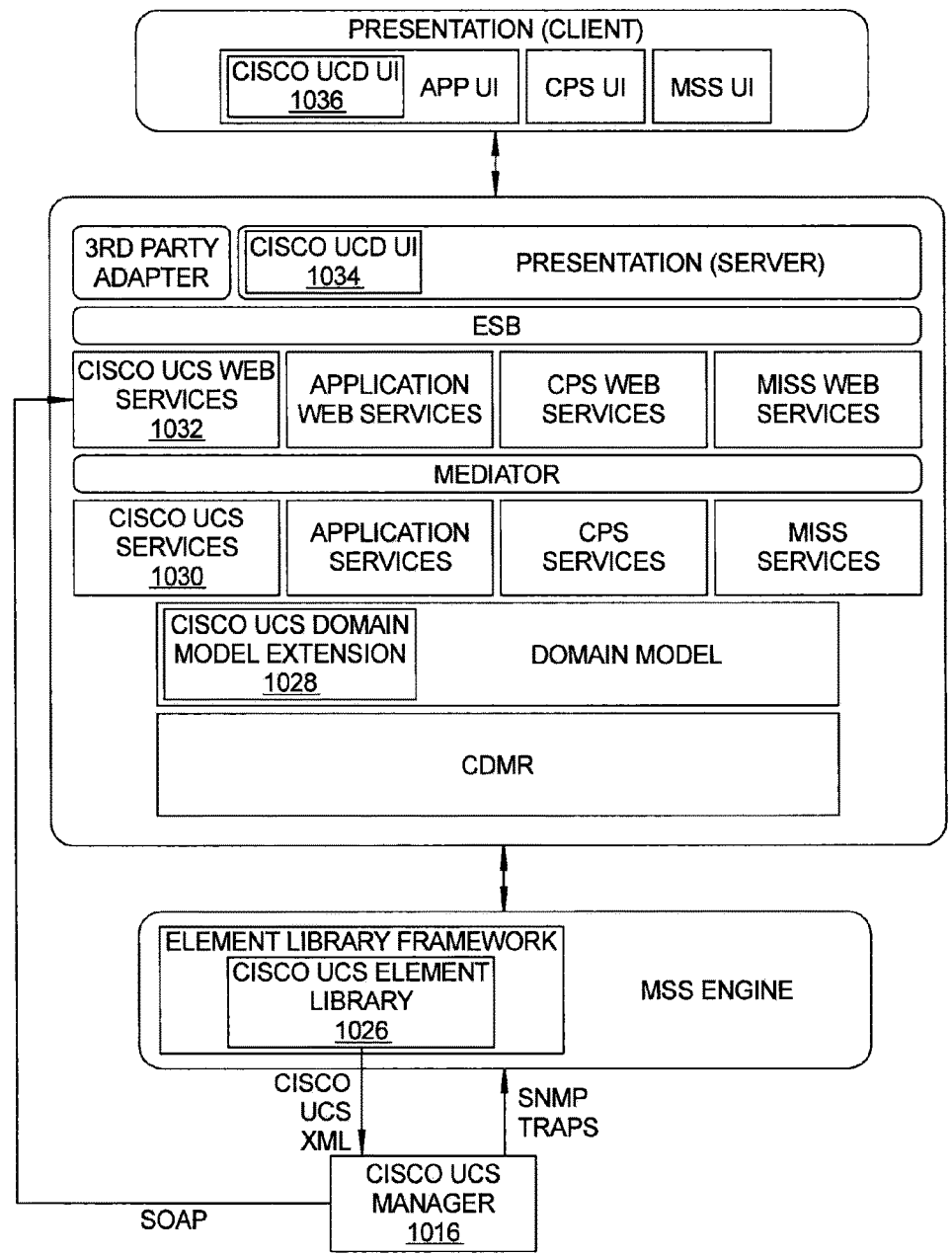
FIG. 18 is a more detailed high level block diagram illustrating the points of integration of the UCS within the various subsystems of the DCIM, pursuant to forming the ICF.

In FIGS. 12, 17 and 18, the ICF 1010 is being used to facilitate direct communication with a Unified Computing System (UCS) 1012 produced by Cisco Systems, Inc. of San Jose, Calif. (hereinafter simply the "UCS 1012"). The UCS 1012 may include a Cisco 6100 Series 20 port fabric interconnect 1014 that includes a Cisco UCS Manager 1016 (hereinafter simply the "UCSM 1016") embedded therein. At least one, but up to two, Cisco 2104XP fabric extenders 1018 may be located in a Cisco 5100 Series blade server chassis 1020. The blade server chassis 1020 may also support up to eight Cisco UCS B-Series blade servers 1022 (available in half width and full width) in a six rack unit (RU) enclosure.

The UCS 1012 may be added to the list of equipment supported by the DCIM system 1000 applications (e.g., Inventory, Monitoring, Configuration, Operations, Facilities Operations and Change Planner). This allows users to install UCS 1012 hardware in racks or chassis with available space, power and cooling. It also allows the UCS 1012 to query the ICF 1010 in real time for availability of power and cooling resources. Importantly, the real time monitoring capability of the ICF 1010 also allows the system user to set a power budget of the chassis 1020, and the ICF 1010 is able to notify the UCS 1012, in real time, in case of critical conditions arising in the data center in which the UCS 1012 is being used.

The UCSM 1016 is the management service for all components of the UCS 1012. It mediates all communication between the ICF 1010 and any component of the UCS 1012. No direct access to the UCS 1012 components (e.g., chassis, blade servers, etc.) is required. FIGS. 17 and 18 show in greater detail specific areas within the DCIM system

1000 where the UCS 1012 is integrated into the DCIM system, to thus form the ICF 1010. In FIG. 17 the letter "U" within a shaded box indicates the location of an integration point within the DCIM system 1000 that helps to form the ICF 1010. FIG. 18, at boxes 1026-1036, indicate specific elements of the UCS 1012 and where such elements may be located within the DCIM system 1000 components.

Various use cases for detailing the interaction between the ICF 1010 and the UCS 1012 are shown in FIGS. 13A and 13B and will be described in the following paragraphs. Additional specific details about each of the use cases outlined in FIG. 13 are presented in the tables of FIGS. 16A-16Q. In one implementation the ICF 1010 element library may be configured to include the UCS 1012 and may call Cisco UCSM XML APIs (Application Programming Interfaces) to communicate directly with the UCSM 1016. The UCSM 1016 APIs can be used to discover the topology of the UCS 1012 equipment (use cases 1 and 2 from FIG. 13A) to collect statistics, to set a power budget (use cases 7, 8 and 9 from FIG. 13A) and to send notifications to the UCS 1012 in case of critical conditions arising in the data center (use case 17 in FIG. 13B). The UCSM 1016 may send SOAP (Simple Object Access Protocol) requests, or may use REST (Representational State Transfer), to communicate with the ICF 1010 Web Services to query for power and cooling availability (use cases 11, 12, 13 and 14 of FIG. 13A/B). It will be appreciated that the ability of the UCSM 1016 to directly query the ICF 1010, in real time, is a principal benefit and advantage of the ICF 1010. The UCS 1012 may also send SNMP (Simple Network Management Protocol) traps to the element library of the ICF 1010, or may use REST, to inform the element library of events such as threshold crossing alerts (TCAs), power state changes, etc (use case 15 of FIG. 13B).

Figure 14:
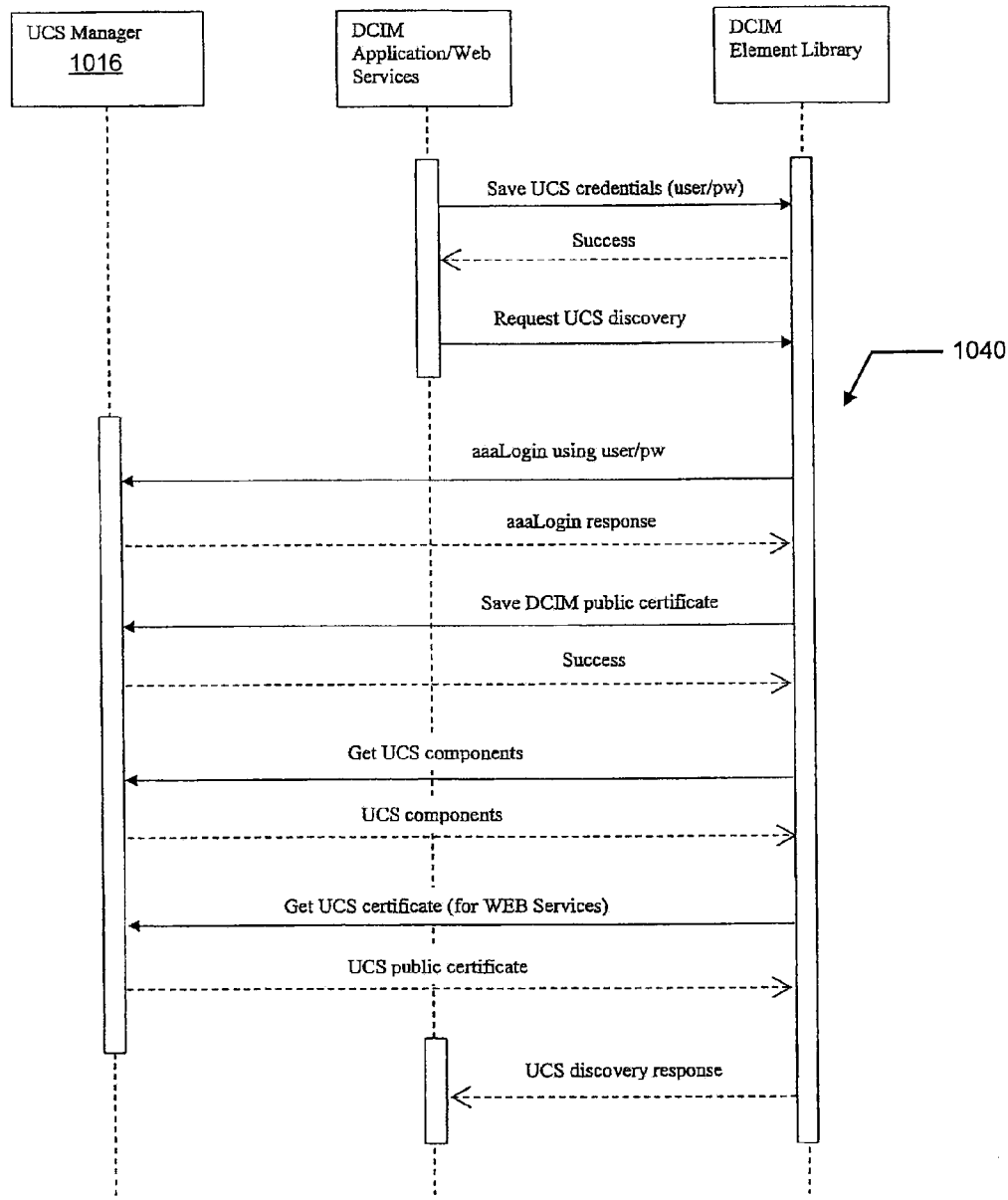
FIG. 14 is a control flow diagram of operations that may be performed when the DCIM system discovers the UCS.

With regard to the first use case listed in the table of FIG. 13A, the ICF 1010 can discover the UCS 1012 in accordance with the actions illustrated in the flow control diagram 1040 of FIG. 14. The ICF 1010 may discover the UCS 1012 after the UCS 1012 FQDN (Full Qualified Domain Name) or IP address, username and password are configured in the ICF 1010 user interface. As passwords can change, the ICF 1010 may save its certificate in the UCS 1012 to avoid dependence on passwords. The ICF 1010 may use the user name and password in the first connection to the UCS 1012, but once the certificate is pushed (i.e., saved) to the UCS 1012, the ICF 1010 will use the certificate to authenticate the UCS 1012 during subsequent contacts initiated by the UCS 1012. The Cisco UCS XML APIs can be used to discover the UCS topology (fabric interconnect, chassis, blades, extenders, etc.). The ICF 1010 may have product knowledge of the UCS 1012 and data points of interest for data acquisition. To allow the UCS 1012 to connect to the DCIM Web Services associated with the ICF 1010, the ICF 1010 can save its own IP in the UCS 1012 and request the UCS to provide its certificate. Once the ICF 1010 saves the UCS certificate the UCS 1012 will be able to authenticate with the DCIM Web Services via the certificate.

Figure 15:
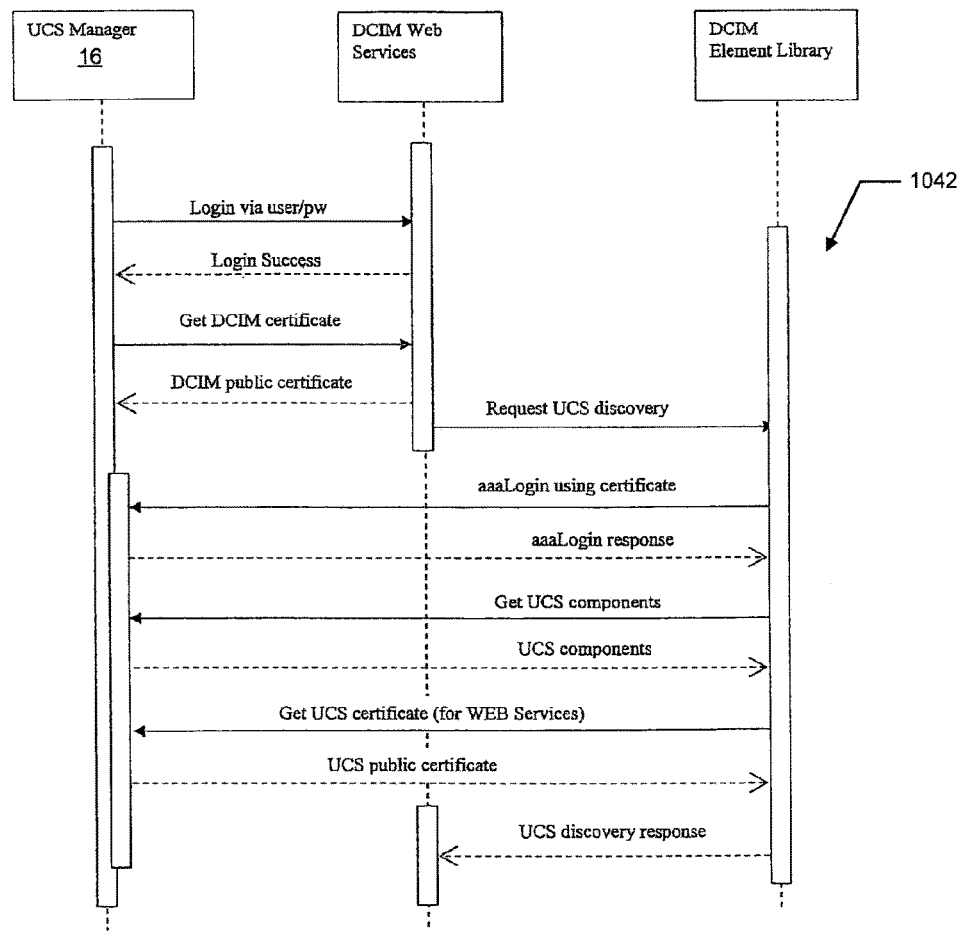
FIG. 15 is a control flow diagram of operations that may be performed by the UCS to discover the DCIM system.

Referring to FIG. 15, a flow control diagram 1042 illustrates various operations that may occur between the ICF 1010 and the UCS 1012 when the UCS discovers the ICF. This alternative manner of discovery involves configuring the UCS 1012 with a new tab in the UCS user interface (UI) specifying the configuration information for the ICF 1010. Fields to input the ICF 1010 FQDM or IP address, username, password and timeout configuration may be made available in the UCS 1012 user interface. The UCS 1012 connects to the ICF 1010 using the username and password, and requests the ICF certificate. The UCS 1012 may save the ICF 1010 certificate to allow the DCIM Element Library to connect to the UCS via the saved certificate. When the UCS 1012 is unknown to the DCIM Web Services, the ICF 1010 may request its Element Library to discover the particular UCS Manager and its components.

As the ICF 1010 password can change, the DCIM Element Library may also request the UCSM 1016 to provide its certificate to allow the UCS 1012 to connect to the DCIM Web Services via the certificate. Once the UCS 1012 certificate is provided, the UCS can use the certificate to authenticate itself to the DCIM Web Services, and thus to the ICF 1010.

DCIM Web Services

The Authentication Web Services and the UCS Web Services are available for the UCS 1012 to request information from the ICF 1010. The Authentication Web Services may provide a login service using a username and a password. This will allow the UCS 1012 to create a session for a particular UCSM 1016 in the ICF 1010. This service would be used only in the case where the UCS 1012 user interface provides the DCIM login configuration, and should only be used in the first-time connection to the ICF 1010. Once the ICF 1010 requests the UCS 1012 certificate, the UCS should preferably use a procedure described below as "LoginViaCertificate". The "LoginViaCertificate" procedure allows the UCS 1012 to log in to the ICF 1010 via an X509 certificate. This allows the UCS 1012 to create a session for its UCSM 1016 in the ICF 1010. The certificate may be used in https and/or with security.

The UCS Web Services may be UCS 1012 specific services, namely "SaveCredentials", "GetDCIMCertificate", "ValidateServers, "GetEnvironmentalData" and "GetChassisAvailableSlotPowerCapacity".

The service "SaveCredentials" allows the UCS 1012 username and password to be saved in the ICF 1010 to allow the ICF to connect to the UCS via XML APIs using a username and password. Inputs may be a session ID; UCS username; UCS password and UCS IP address. An output may be a "ResultStatus" result, which is sent to the UCS 1012 by the ICF 1010 to indicate if the operation was successful or not.

The "GetDCIMCertificate" is a service that obtains the DCIM public certificate that will be used by the ICF 1010. The returned certificate will be saved in the UCS 1012 to allow the ICF 1010 of the DCIM system 1000 to authenticate with the UCSM 1016 via a certificate. The input may be a session ID. Outputs may be an X509Certificate certificate and a ResultStatus result, with the ResultStatus result being sent to the UCS 1012 by the ICF 1010 to indicate if the operation was successful or not.

The "ValidateServersAction" web service involves the ICF 1010 validating the action based on data center rules (e.g., user predefined rules governing power and cooling availability) for the selected servers. The ICF 1010 returns a response to the UCS 1012 informing the UCS which servers from a stored input list of servers can have the requested action executed (Use cases 11 and 12 in FIG. 13A). The action requested may be "PowerOn", "PowerOff" or "PowerMaintenanceOn" (where "PowerMaintenanceON" would be only the power needed to run the utility operating system, not the full power on for the server). Inputs may be a session ID, action, "UcsBladeServer servers" and the number of servers to be powered on or off, if possible. The "UcsBladeServer" input contains information about a "DN" (where the DN represents a unique, distinguished name assigned to each UCS 1012 component), priority and blade type. If blade type is not defined, it may be assumed that the action is for the maximum nameplate capacity of the blade. Outputs may be "ResultStatus" result and a list of UCS Blade Servers that can execute the requested action.

The "GetEnvironmentalData" service may obtain environment data (e.g., concerning any sensor in the rack where the chassis is, power metrics of the chassis, etc.) of specific components of the UCS 1012. Inputs may be the session ID and the UCS DN. The output may be "ResultStatus" result and the environmental data.

The service "GetChassisAvailableSlotPowerCapacity" obtains the power capacity of empty slots of the chassis 1020 (FIG. 12). This helps users to insert their blade servers in the optimal locations. The power capacity may be an index that indicates how much power capacity is available to insert new blade servers. Inputs may be a session ID, empty UCS Chassis slots, and the number of servers to be inserted (optional, 1 by default). The output may be a list of empty slots with power capacity information, which may be an index used to sort these empty slots.

UCSM XML APIs

UCSM XML APIs may be used by the ICF 1010 to retrieve or set data from or to any UCS 1012 equipment component. The requests may be sent to the UCS 1012 manager which gets data from, or sends data to, the specific component (e.g., chassis, blades, etc.). Existing XML APIs that the ICF 1010 may call are "aaaLogin", "aaaRefresh", and APIs to get UCS 1012 components (use cases 1 and 2 in FIG. 13A). An API to set the power budget of a chassis may also be implemented (use cases 7, 8 and 9 in FIG. 13A). A plurality of new UCSM 1016 APIs may be required by the ICF 1010. One such UCSM 1016 API is "Save certificate", which saves the DCIM system 1000 public certificate, and which allows the ICF 1010 to authenticate with the UCSM 1016 via certificate. The "Save certificate" API can generate as an output a X509Certificate certificate and a Success/Failure message. Another UCSM API is "Get UCS certificate", which obtains the UCS public certificate. The ICF 1010 may save the returned certificate to allow the UCSM 1016 to authenticate with DCIM Web Services using the certificate. The UCS 1012 will save the DCIM IP to know the DCIM Web Services IP. The input may be the IP address of DCIM web service and the output may be an X509 certificate and a "Success/Failure' message. Another UCSM 1016 API may be a "Login via certificate" which facilitates a login to the UCSM using a certificate and obtaining an authentication cookie. The input may be a X509 certificate and the output may be an "outCookie" and a Success/Failure message. Further possible APIs may involve APIs to add, delete or change rules concerning operation of the UCS 1012.

Still another UCSM 1016 API may be an "Event reception" API where the ICF 1010 sends events to the UCS 1012 for critical conditions that arise (Use case 17 in FIG. 13B). Such conditions could involve, for example, an uninterruptible power supply battery going low. This will allow the UCS 1012 to take some action, for example, re-associate service profiles. An input may be a notification that a critical event happened in the data center. For example, consider the situation where a power outage is detected and power is automatically switched to UPS (uninterruptible power supply) mode. Since the ICF 1010 of the DCIM system 1000 knows all the UCS chassis powered by that UPS, the ICF 1010 can post an alert via this API in order to notify the UCSM 1016. The UCSM 1016 can then decide what action is required given the notification received. One action might be to migrate the riskier applications running on the affected blades to another UCS chassis. An output may be a "Success/Failure" message.

Yet another UCSM 1016 API is "Save physical information of a DN". This API saves the physical location of specific components of the UCS 1012. The physical location could be a new attribute displayed by the UCSM 1016. An input may be "PhysicalLocation location" to indicate in which rack that particular UCS 1012 component is located. An output may be a "Success/Failure" message.

UCS Notifications to the DCIM

In addition to receiving notifications from the UCSM 1016 via the XML APIs, the UCSM 1016 may also provide notifications to the ICF 1010 via SNMP traps or possibly via REST. The XML API offers event subscription and the subscriber may be informed about every single change in the UCSM 1016 management information tree. Thus, every single time an object changes because of a user or a system action, an event is generated. Notifications from the UCSM 1016 via SNMP traps or REST may alternatively operate to report only some specific occurrences. As an example, the UCSM 1016 allows many types of threshold crossing alerts (TCAs) to be configured, and they can all be retrieved via SNMP traps. It will also be appreciated that the UCS 1012 may be provided with the capability to filter which notifications are sent to the ICF 1010.

Statistics Collection

The UCS 1012 also has the capability to allow statistics (e.g., power supply voltage, current, power, ambient temperature, etc.) to be collected via polling. If the UCS 1012 was modified to permit "pushing" the statistics to the ICF 1010 instead of being polled, then collected data points may be based on the UCS 1012 capabilities as detailed in the UCS design phase.

FIG. 19 illustrates a table which is an example of various symbols that are presently available for the UCS 1012. It will be understood that this list is merely exemplary and may be readily expanded with additional symbols as needs arise.

Using the DCIM System 1000 in Connection with VMware Components

Referring now to FIG. 20, there is shown a chart of various use cases in which the DCIM system 1000 may be used in connection with equipment manufactured by VMware, Inc. of Palo Alto, Calif. It will be appreciated that while the chart of FIG. 20 lists four specific use cases, that various other use cases for other specific types of equipment manufactured by VMware, Inc., as well as other manufacturers, may potentially be implemented using the DCIM.

FIGS. 21A-21C set forth various considerations and operations of use case 1 in FIG. 20 that may be taken into account by the DCIM system 1000 in provisioning new hardware into ESX clusters, and into the physical infrastructure of a data center where the DCIM system 1000 is being employed.

FIGS. 22A and 22B detail the considerations and various operations associated with use case 2 of FIG. 20. In this instance the DCIM system 1000 interacts with the VMware DRS (Dynamic Resource Scheduler) when provisioning new VMs into clusters. This feature uses the DCIM system 1000 to take into account various important factors such as real time power, cooling data, network and memory resource availability, while taking into account power budget and redundancy policies, hot spots and dynamic cooling environment.

FIGS. 23A and 23B detail various considerations and operations of use case 3 in FIG. 20 where the DCIM system 1000 is used to help with deciding a power and cooling appropriate location for migrating all the VMs on an ESX server host for maintenance purposes. Again, the DCIM system 1000 may use continuous and real time dynamic measurements collected from the data center to report actual power and cooling usage, rather than relying on peak power capacity listed on static nameplate ratings for the equipment being considered.

FIGS. 24A and 24B detail various considerations and operations of use case 4 in FIG. 20 where the DCIM system 1000 is used in rebalancing VMs based on changing physical conditions in a data center, or changes in data center policies. This decision will affect a migration recommendation in VMware systems. In this example the DCIM system 1000 interacts with the DRS to provide real time power and cooling data availability, taking into account power budget and power redundancy policies, hot spots and dynamic cooling and humidity considerations of the data center environment. The DRS dynamic rebalancing algorithm may be enhanced to incorporate DCIM VM migration recommendations based on the real time power, cooling and humidity data.

It will be appreciated then that the two-way communication, architecture design and software associated with the ICF 1010 allows the ICF to provide knowledge to the managed device (e.g., UCS 1012, the VMware device, or other form of managed device) about real-time resource availability (e.g., physical space in an equipment rack, power presently available to the rack, cooling being provided to the rack, etc.) and real time network and storage availability or limitations. The ICF 1010 can also provide real time information concerning a data center layout and policies (e.g., power budget, power redundancy, hot spots, dynamic cooling environment, weight restrictions, etc.) to the devices enrolled to communicate with the ICF 1010. Based on the real time information provided by the ICF 1010, each enrolled managed device of the data center is able to make prudent decisions locally and to provide better information to their respective users and management applications for use in managing/configuring/using each enrolled device.

The ICF 1010 software is able to make use of real time dynamic measurements (data points) collected from the datacenter to report the actual power and cooling usage instead of relying on peak capacity provided on static nameplate ratings of each component being monitored. Specific examples of ecosystem parameters that may be dynamically reported by the ICF 1010 may involve:

a situation where an infrastructure (power or cooling) alarm or unit failure arises that may not impact operation due to redundancy, but which gives rise to an additional risk to the user because of a reduction in availability of a backup component;

a situation where temperature and humidity risks due to out of tolerance for a given device's specific requirements arises;

a situation where a current load has fallen to the point where an entire zone (power or cooling) can be vacated and equipment therein moved to a "standby" condition;

situations where power rate changing occurs, such as when power rates change at a certain time of the day;

situations where power constraints are experienced or when an alternative (e.g., backup) power source has been engaged;

situations where non-time sensitive workloads (batch processes) can be run due to more cost effective power rates becoming available during a specific time of day; and situations where a load may now be moved to a different location to take more economical advantage of power or cooling availability.

In summary, the ICF 1010 allows data centers to operate at much closer to full capacity without the risk of an overload, which can potentially lead to a more favorable return on capital investments and/or potentially delay the expenditure on new equipment. Importantly, the ICF 1010 performs a "what if" type analysis in real time when contacted by each enrolled component, and is able to advise the component as to whether taking a requested action will negatively influence the overall consumption of infrastructure resources or possibly negatively influence the operation of some other device or subsystem within the data center.

A particularly important advantage of the ICF 1010 working with the DCIM system 1000 is that it can significantly increase the capacity utilization of the components within a data center. This can lead to a decrease in the power consumption of the cooling equipment used to cool the components within the data center. The real time capability and "what-if" scenario analysis performed by the ICF 1010 can also potentially reduce down-time of equipment within a data center that would otherwise have been caused by human error by providing information to the managed device before the managed device takes the action requested by a human operation. Still further, the ICF 1010 is expected to have significant utility in applications involving the control of CRACs (Computer Room Air Conditioners). The ICF 1010 can be used to control on/off operation of the fans associated with CRACs, in real time, to bring the overall cooling capacity more closely in line with the real time cooling requirements in a data center, to thus reduce excess cooling capacity.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A data center infrastructure management (DCIM) system including:
   an infrastructure control fabric (ICF) subsystem included in the DCIM system and adapted to help monitor and control an independent computing device being managed by the DCIM system;
   a manager component adapted to be included within the independent computing device, the manager component being configured to communicate directly with infrastructure management tools of the DCIM system, and to provide information to the independent computing device in response to a query from the independent computing device, which enables the independent computing device to determine if an action can be taken, and without disrupting a user interface of the independent computing device, and while working in a side-by-side fashion with the independent computing device;
   a manageability subsystem engine for monitoring data being transmitted from the independent computing device,
   a domain model that includes an extension relating to information on the independent computing device;
   a services server for providing a shared services infrastructure layer; and
   wherein the ICF subsystem also includes components located in at least one of the manageability subsystem engine, the domain model, and on the services server, to enable the independent computing device to directly query the DCIM system, before taking a requested action, to obtain at least one of real time power, cooling and space information that is provided to the independent computing device, and which is useful for the independent computing device to know before initiating an operation or continuing with an operation, and before commanding another independent computing device to take a specified action that would otherwise violate at least one of a cooling or power capacity budget.

2. The DCIM system of claim 1, wherein the components of the ICF subsystem include an element library in the manageability subsystem engine that has information on the independent computing device.

3. The DCIM system of claim 2, wherein the element library includes at least one of the following elements associated with the independent computing device:
   fabric interconnects;
   a chassis;
   a fan;
   a power supply;
   a full-width blade server;
   a half-width blade server; and
   a rack mount server.

4. The DCIM system of claim 1, wherein the information in the extension of the domain model includes information regarding configuration and operation of the independent computing device.

5. The DCIM system of claim 1, wherein the ICF subsystem is configured to automatically discover the manager component of the independent computing device after inputting into a ICF subsystem user interface at least one of the following:
   a full qualified domain name (FQDN) of the independent computing device;
   an internet address of the independent computing device;
   a user name; and
   a user password.

6. The DCIM system of claim 1, further comprising a user interface for the independent computing device, with the user interface adapted to enable a user to enter configuration information for the ICF subsystem.

7. The DCIM system of claim 6, wherein the user interface for the independent computing device comprises fields for receiving information concerning an internet protocol (IP) address of the ICF subsystem, a user name, a user password and a timeout configuration.

8. The DCIM system of claim 1, wherein the manager component of the independent computing device includes extensible markup language (XML) application programming interfaces (APIs) that are used by the ICF subsystem to call the independent computing device and to discover a topology of the independent computing device.

9. The DCIM system of claim 1, wherein manager component of the independent computing device sends Simple Object Access Protocol (SOAP) requests to communicate with the ICF subsystem, to thus query the ICF subsystem, in real time, for power and cooling availability information.

10. The DCIM system of claim 1, wherein the manager component of the independent computing device uses Representational State Transfer (REST) to communicate with the ICF subsystem.

11. The DCIM system of claim 1, wherein the ICF subsystem is configured to receive Simple Network Management Protocol (SNMP) traps from the independent computing device that inform the ICF subsystem of operation events relating to operation of the independent computing device.

12. The DCIM system of claim 1, wherein the ICF subsystem is configured to at least one of:
  set a power budget for the independent computing device and to communicate the power budget to the independent computing device;
  to notify the independent computing device of environmental or operational conditions arising in a data center in which the independent computing device is operating; and
  collect statistics concerning operation of the independent computing device.

13. The DCIM system of claim 1, wherein a DCIM system public certificate is transmitted to the independent computing device and used for authenticating the ICF subsystem to the independent computing device.

14. The DCIM system of claim 1, wherein the DCIM system is configured to receive a certificate from the independent computing device that the ICF subsystem is able to use to authenticate the independent computing device.

15. A method for enabling a data center infrastructure management (DCIM) system to communicate directly, and in real time, with an independent computing device, the method including:
  using a manager component, which forms a portion of the independent computing device, to send requests for information and to receive responses, in a manner which is transparent to a user of the independent computing device while the user is using the independent computing device;
  using an infrastructure control fabric (ICF) subsystem, which forms a portion of the DCIM system, for enabling the manager component of the independent computing device to communicate directly with the DCIM system, when sending the requests and receiving the responses;
  locating an element library in a specific subsystem of the DCIM system, wherein the element library has information on the independent computing device; and
  using the element library to assist in enabling the independent computing device to directly query the DCIM system, by using the manager component, in real time, to obtain at least one of real time power, real time cooling, and space information that is provided to the independent computing device, upon a query from the independent computing device, and which is useful for the independent computing device to know before initiating an operation or continuing with an operation, and before commanding another independent computing device to take a specified action that would otherwise violate at least one of a cooling or power capacity budget.

16. The method of claim 15, further comprising:
  using a manageability subsystem engine of the DCIM system for monitoring data being transmitted from the independent computing device,
  using a domain model of the DCIM system that includes an extension, where the extension includes information concerning the independent computing device;
  using a manageability subsystem of the DCIM system to receive information from the independent computing device;
  using a services server of the DCIM system for providing a shared services infrastructure layer; and
  locating components of the ICF subsystem in each of the manageability subsystem engine, the domain model, and on the services server.

17. The method of claim 16, wherein the operation of locating components of the ICF subsystem includes locating an element library in the manageability subsystem engine that has information on the independent computing device.

18. A method for enabling a data center infrastructure management (DCIM) system to communicate directly, and in real time, with an independent computing device, the method including:
  using a manager component, which forms a portion of the independent computing device, to send requests and receive responses, in a manner which is transparent to a user of the independent computing device while using the independent computing device;
  using an infrastructure control fabric (ICF) subsystem for enabling the manager component of the independent computing device to communicate directly with a DCIM system,
  using a manageability subsystem engine of the DCIM system for monitoring data being transmitted from the independent computing device,
  using a domain model of the DCIM system that includes an extension, where the extension includes information concerning the independent computing device;
  using a manageability subsystem of the DCIM system to receive information from the independent computing device;
  using a services server of the DCIM system for providing a shared services infrastructure layer; and
  locating components of the ICF subsystem in each of the manageability subsystem engine, the domain model, on the services server, to enable the independent computing device to directly query the DCIM system, and to obtain responses from the DCIM system, relating to at least one of real time power, real time cooling, and space information that is provided to the independent computing device, upon a query from the independent computing device, and which is useful for the independent computing device to know before at least one of initiating an operation or continuing with an operation, and before commanding another independent computing device to take a specified action that would otherwise violate at least one of a cooling or power capacity budget.

19. The method of claim 18, wherein the operation of locating components of the ICF subsystem includes locating an element library in the manageability subsystem engine that has information on the independent device.

20. The method of claim 19, wherein the operation of locating an element library includes locating at least one of the following elements associated with the independent computing device:
  fabric interconnects;
  a chassis;
  a fan;
  a power supply;
  a full-width blade server;

a half-width blade server; and a rack mount server.

21. The method of claim 18, wherein the information in the domain model extension includes information regarding configuration and operation of the independent computing device.

22. The method of claim 18, further comprising using a user interface for the independent computing device, with the user interface adapted to enable a user to enter configuration information for the ICF subsystem.

23. The method of claim 22, further comprising providing the user interface for the independent computing device with fields for receiving information concerning an internet protocol (IP) address of the ICF subsystem, a user name, a user password and a timeout configuration.

\* \* \* \* \*

UNITED STATES PATENT AND TRADEMARK OFFICE
CERTIFICATE OF CORRECTION

| | |
|---|---|
| PATENT NO. | : 9,715,222 B2 |
| APPLICATION NO. | : 13/984417 |
| DATED | : July 25, 2017 |
| INVENTOR(S) | : Arnaldo Zimmermann et al. |

It is certified that error appears in the above-identified patent and that said Letters Patent is hereby corrected as shown below:

On the Title Page

Column 1 item (75), Inventors,
Line 6, delete "Madison," and insert --Huntsville,-- therefor.

In the Claims

Column 34,
Claim 19, Line 58, after "independent", insert --computing--.

Signed and Sealed this
Twenty-second Day of May, 2018

Andrei Iancu
*Director of the United States Patent and Trademark Office*